(12) United States Patent
Kawada et al.

(10) Patent No.: US 10,276,298 B2
(45) Date of Patent: Apr. 30, 2019

(54) TRANSFORMER, AND SWITCHING POWER SUPPLY AND ISOLATOR INCLUDING TRANSFORMER

(71) Applicant: Panasonic Intellectual Property Management Co., Ltd., Osaka (JP)

(72) Inventors: Hiroshi Kawada, Osaka (JP); Minoru Kumahara, Osaka (JP); Takahiro Miyatake, Osaka (JP); Yoshiyuki Kajimoto, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/541,450

(22) PCT Filed: Apr. 13, 2016

(86) PCT No.: PCT/JP2016/001993
§ 371 (c)(1),
(2) Date: Jul. 3, 2017

(87) PCT Pub. No.: WO2016/170755
PCT Pub. Date: Oct. 27, 2016

(65) Prior Publication Data
US 2017/0372834 A1    Dec. 28, 2017

(30) Foreign Application Priority Data
Apr. 24, 2015 (JP) .................. 2015-089575

(51) Int. Cl.
*H01F 27/28* (2006.01)
*H01F 5/00* (2006.01)
(Continued)

(52) U.S. Cl.
CPC .............. *H01F 27/32* (2013.01); *H01F 17/04* (2013.01); *H01F 27/2804* (2013.01);
(Continued)

(58) Field of Classification Search
CPC ...... H01F 5/003; H01F 27/32; H01F 27/2804; H01F 27/28; H01F 27/29; H01F 17/04;
(Continued)

(56) References Cited

U.S. PATENT DOCUMENTS 5,990,776 A * 11/1999 Jitaru .................... H01F 7/2804
                                                                336/200
7,009,486 B1 * 3/2006 Goeke ................. H01F 27/2804
                                                                336/229
(Continued)

FOREIGN PATENT DOCUMENTS

JP         10-149929         6/1998

OTHER PUBLICATIONS

International Search Report of PCT application No. PCT/JP2016/001993 dated Jun. 14, 2016.

*Primary Examiner* — Mang Tin Bik Lian
(74) *Attorney, Agent, or Firm* — McDermott Will & Emery LLP

(57) ABSTRACT

A transformer includes a multilayer board including insulation layers stacked in a thickness direction, a primary coil provided on at least one of the insulation layers, and a secondary coil provided on at least one of the insulation layers. The primary coil includes first sub coils electrically connected in series to each other, and second sub coils electrically connected in series to each other. Surfaces of the plurality of insulation layers constitute layer planes of the multilayer board. At least two of the first sub coils are provided on layer planes out of the layer plane different from each other. At least two of the second sub coils are provided on layer planes out of the layer planes different from each other. An average of positions of the first sub coils in the thickness direction is aligned with an average of positions of the second sub coils in the thickness direction.

17 Claims, 19 Drawing Sheets

(51) Int. Cl.
  *H01F 27/29*   (2006.01)
  *H01F 27/32*   (2006.01)
  *H01F 30/10*   (2006.01)
  *H02M 3/28*    (2006.01)
  *H01F 17/04*   (2006.01)
  *H05K 1/02*    (2006.01)
  *H01F 27/40*   (2006.01)
  *H01F 19/08*   (2006.01)

(52) U.S. Cl.
  CPC ............ *H01F 27/40* (2013.01); *H01F 30/10* (2013.01); *H02M 3/28* (2013.01); *H05K 1/0298* (2013.01); *H01F 2019/085* (2013.01); *H01F 2027/2809* (2013.01); *H01F 2027/408* (2013.01)

(58) Field of Classification Search
  CPC .... H01F 17/006; H01F 17/0013; H01F 30/10; H01F 21/12; H01F 2027/2809; H01F 2021/125; H01F 2019/085; H01F 29/02; H01F 29/025; H01F 29/04; H01F 2017/0073; H02M 3/28; H05K 1/0298
  USPC .......................... 336/200, 170, 192, 232, 223
  See application file for complete search history.

(56)   References Cited

U.S. PATENT DOCUMENTS 7,012,703    B2 *   3/2006    Allman ............. G01D 5/24452
                                                              250/231.13
  8,334,747    B2 *   12/2012   Matsumoto ............ H01F 27/22
                                                              336/200
  2010/0289610 A1 *   11/2010   Jacobson ............ H01F 27/2804
                                                              336/84 C
  2015/0371761 A1 *   12/2015   Yosui ................... H03H 7/0115
                                                              343/850

* cited by examiner

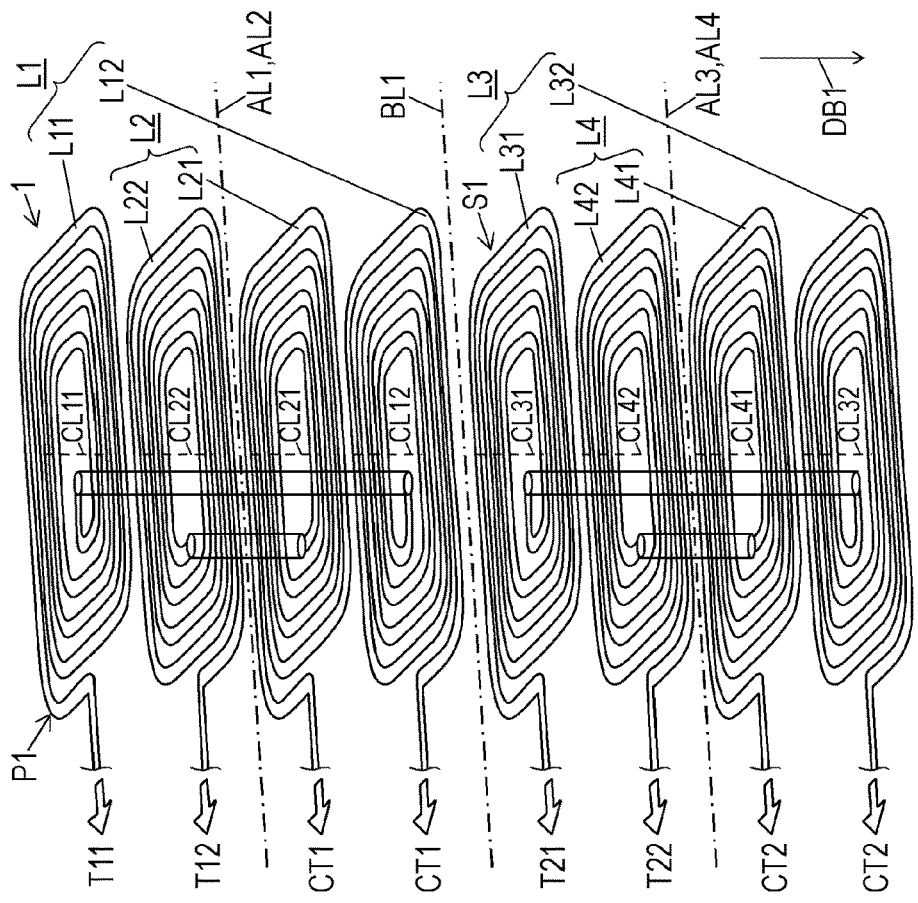
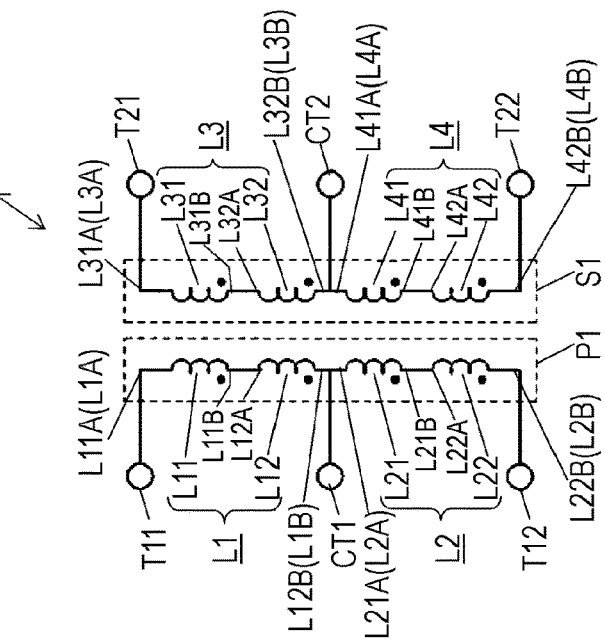

FIG. 18B
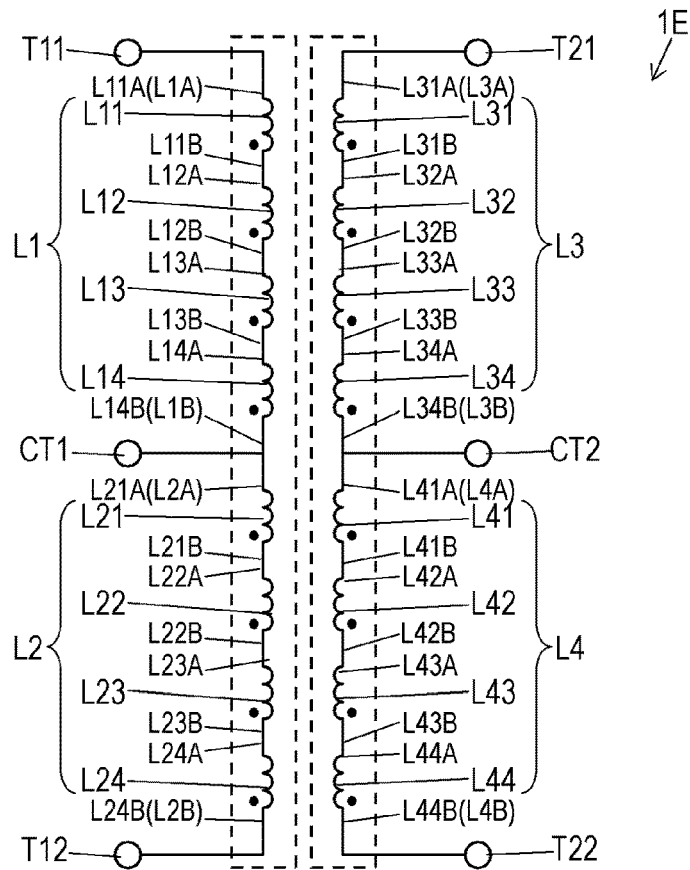
FIG. 19A                    FIG. 19B
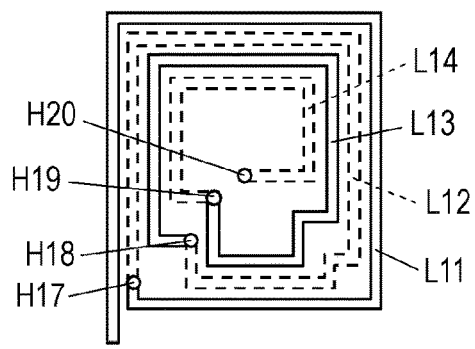 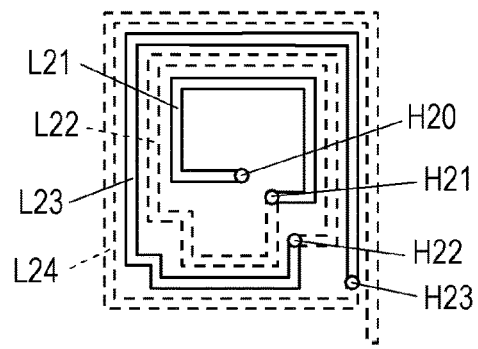

TRANSFORMER, AND SWITCHING POWER SUPPLY AND ISOLATOR INCLUDING TRANSFORMER

This application is a U.S. national stage application of the PCT international application No. PCT/JP2016/001993 filed on Apr. 13, 2016, which claims the benefit of foreign priority of Japanese patent application No. 2015-089575 filed on Apr. 24, 2015, the contents all of which are incorporated herein by reference.

TECHNICAL FIELD

The present invention relates to a transformer including a multilayer board having coils provided therein, and also to a switching power supply and an isolator including this transformer.

BACKGROUND ART

PTL 1 discloses a conventional transformer including a multilayer board having coils provided therein. In a printed coil type transformer disclosed in PTL 1, five base materials are stacked, and a core made of magnetic material passes through centers of these base materials. A secondary coil is provided on a front surface and a rear surface of the first layer out of the base materials. The secondary coil is also provided on each of a front surface and a rear surface of the second layer out of the base materials. A primary coil is provided on each of a front surface and a rear surface of the fourth layer out of the base materials. The primary coil is also provided on each of a front surface and a rear surface of the fifth layer out of the base materials.

CITATION LIST

Patent Literature

PTL 1: Japanese Patent Laid-Open Publication No. 10-149929

SUMMARY

A transformer includes a multilayer board including insulation layers stacked in a thickness direction, a primary coil provided on at least one of the insulation layers of the multilayer board, and a secondary coil provided on at least one of the insulation layers of the multilayer board. The primary coil includes first sub coils electrically connected in series to each other, and second sub coils electrically connected in series to each. Surfaces of the insulation layers constitute layer planes of the multilayer board. At least two of the first sub coils are provided on layer planes out of the layer planes different from each other. At least two of the second sub coils are provided on layer planes out of the layer plane different from each other. An average of positions of the first sub coils is aligned with an average of positions of the second sub coils in the thickness direction.

The transformer can prevent an output voltage drop on a secondary side and lowering of power conversion efficiency.

BRIEF DESCRIPTION OF DRAWINGS

FIG. 1A is a schematic circuit diagram of a transformer according to Exemplary Embodiment 1.

FIG. 1B is a schematic diagram of the transformer according to Embodiment 1 for illustrating an arrangement of coils of the transformer.

FIG. 18B is a schematic circuit diagram of the transformer according to Embodiment 4.

FIG. 19A is a schematic top view of the transformer according to Embodiment 4 for illustrating an arrangement of coils of the transformer.

FIG. 19B is a schematic top view of the transformer according to Embodiment 4 for illustrating an arrangement of coils of the transformer.

DETAIL DESCRIPTION OF PREFERRED EMBODIMENTS

Exemplary Embodiment 1

FIG. 1A is a schematic circuit diagram of transformer 1 according to Exemplary Embodiment 1. Transformer 1 includes primary coil P1 and secondary coil S1. Secondary coil S1 is magnetically coupled with primary coil P1.

Primary coil P1 includes coils L1 and L2. Coil L1 includes plural (two in this example) sub coils L11 and L12 electrically connected in series to each other. Coil L2 includes plural (two in this example) sub coils L21 and L22 electrically connected in series to each other.

FIG. 1B is a schematic diagram of the transformer for illustrating an arrangement of coils L1 to L4. FIGS. 2A to 2D are schematic top views illustrate insulation layers having primary coil P1 provided thereon. FIGS. 3A to 3D are schematic top views of insulation layers having secondary coil S1 provided thereon. FIG. 4 is a schematic cross-sectional view of multilayer board B1 of transformer 1. Transformer 1 includes multilayer board B1. Primary coil P1 is provided in multilayer board B1. Secondary coil S1 is provided in multilayer board B1. At least a part of sub coil L11 and at least a part of sub coil L12 of the sub coils are provided on layers of multilayer board B1 which are different from each other. Similarly, at least a part of sub coil L21 and at least a part of sub coil L22 of the sub coils are provided on layers different from each other, respectively, in multilayer board B1. Average position AL1 of positions of sub coils L11 and L12 is aligned with average position AL2 of positions of the plurality of sub coils L21 and L22 in thickness direction DB1 of multilayer board B1.

Figure 5:
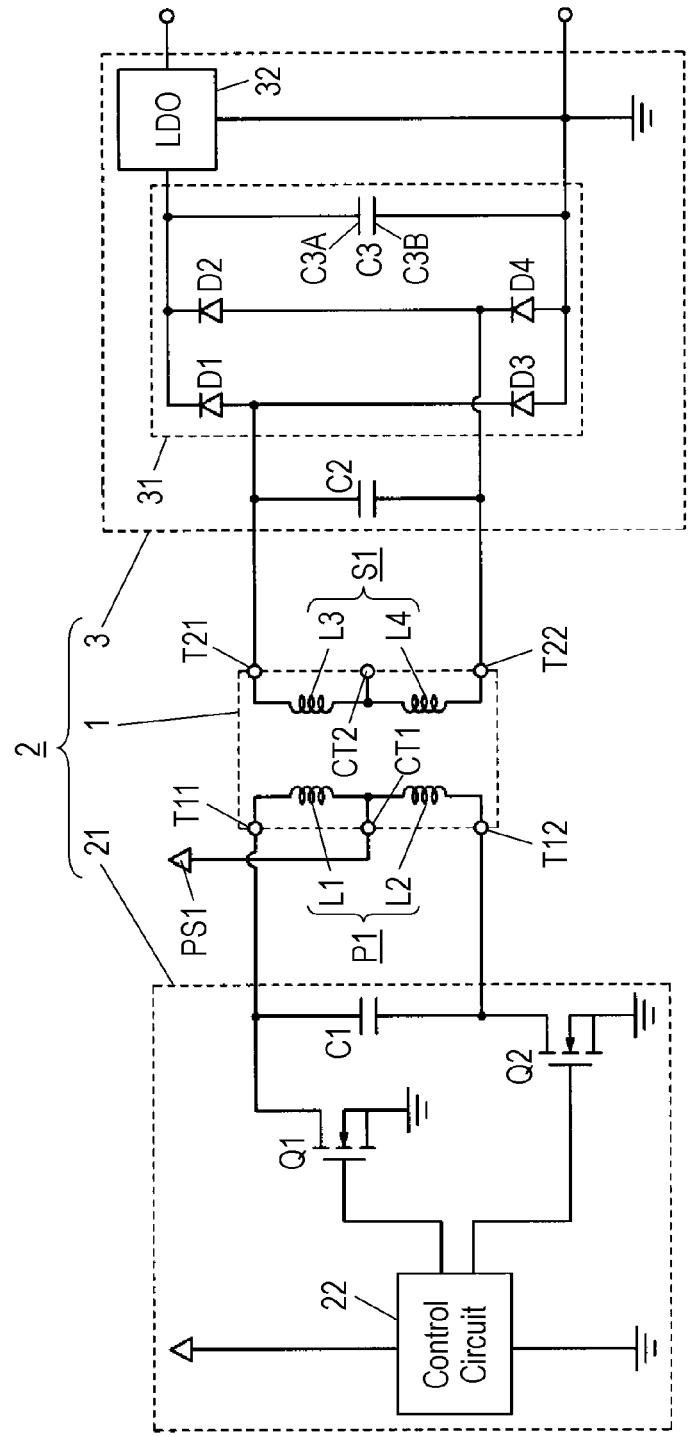
FIG. 5 is a schematic circuit diagram of a switching power supply according to Embodiment 1.

FIG. 5 is a schematic circuit diagram of switching power supply 2 according to Embodiment 1. Switching power supply 2 includes transformer 1, switching element Q1, switching element Q2, and control circuit 22. Switching element Q1 is configured to open and close a power supply path from external power supply PS1 to coil L1. Switching element Q2 is configured to open and close a power supply path from external power supply PS1 to coil L2. Control circuit 22 is configured to control switching element Q1 and switching element Q2 to cause a current to flow alternately in coil L1 and coil L2.

Figure 6A:
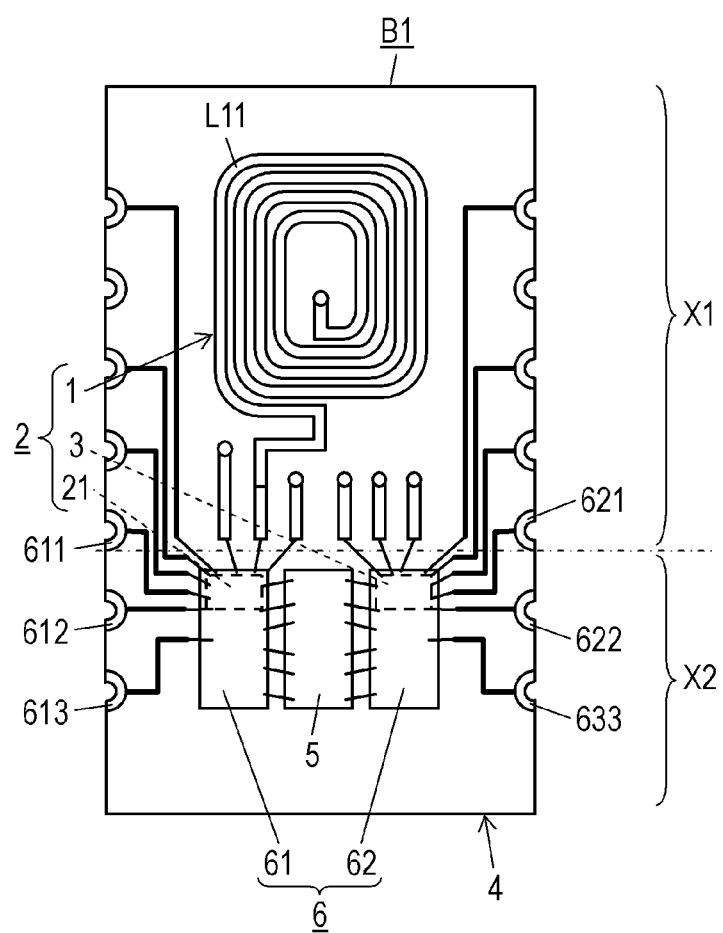
FIG. 6A is a schematic top view of an isolator according to Embodiment 1.
Figure 6B:
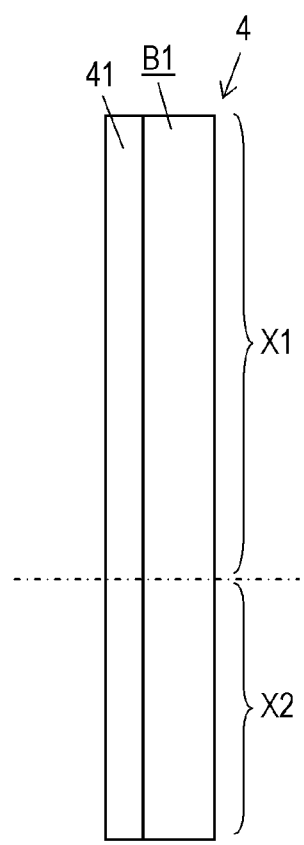
FIG. 6B is a schematic side view of the isolator illustrated in FIG. 6A.

FIG. 6A is a schematic plan view of isolator 4 according to Embodiment 1. FIG. 6B is a schematic side view of isolator 4 illustrated in FIG. 6A. Isolator 4 includes switching power supply 2, isolation circuit 5, and signal processing circuit 6. Isolation circuit 5 including a primary side and a secondary side electrically isolates input signals input to the primary side from output signals output to the secondary side in accordance with input signals. Signal processing circuit 6 processes input signals and output signals. Each of isolation circuit 5 and signal processing circuit 6 is provided in multilayer board B1.

<Structure of Transformer 1>

Transformer 1 according to Embodiment 1 will be detailed below. In the following description, thickness direction DB1 of multilayer board B1 is shown as an up-down direction. A direction of insulation layer B11 from insulation layer B12 is upward direction DB1A while a direction of insulation layer B12 viewed from insulation layer B11 is downward direction DB1B. In other words, the up-down direction in the following description is shown as an up-down direction in FIG. 4. These definitions of directions do not impose any limitations to usage of transformer 1 according to Embodiment 1.

As illustrated in FIGS. 1A and 1B, primary coil P1 of transformer 1 includes intermediate tap CT1 and a pair of input ports T11 and T12 while secondary coil S1 of transformer 1 includes intermediate tap CT2 and a pair of output ports T21 and T22.

Primary coil P1 includes coil L1 and coil L2. End L1A of coil L1 is electrically connected to input port T11 while end L1B of coil L1 is electrically connected to intermediate tap CT1. End L2A of coil L2 is electrically connected to intermediate tap CT1 while end L2B of coil L2 is electrically connected to input port T12. Coil L1 and coil L2 are thus electrically connected to intermediate tap CT1 of primary coil P1.

Secondary coil S1 includes coil L3, and coil L4. End L3A of coil L3 is electrically connected to output port T21 while end L3B of coil L3 is electrically connected to intermediate tap CT2. End L4A of coil L4 is electrically connected to intermediate tap CT2 while end L4B of coil L4 is electrically connected to output port T22. Coil L3 and coil L4 are thus electrically connected to intermediate tap CT2 of secondary coil S1.

Coil L1 includes plural (two in this example) sub coils L11 and L12 electrically connected in series to each other. Coil L2 includes plural (two in this example) sub coils L21 and L22 electrically connected in series to each other. Coil L3 includes plural (two in this example) sub coils L31 and L32 electrically connected in series to each other in series. Coil L4 includes plural (two in this example) sub coils L41 and L42 electrically connected in series to each other.

Multilayer board B1 is a printed circuit board made of, e.g. Flame Retardant Type 4 (FR4). As illustrated in FIGS. 2A to 2D, 3A to 3D, and 4, multilayer board B1 includes plural (eight in this example) insulation layers B11 to B18 stacked on one another. Insulation layers B11 to B18 are stacked in this order in thickness direction DB1. Each of insulation layers B11 to B18 is made of, e.g. prepreg material. Each of insulation layers B11 to B18 has upper surface and lower surface which are perpendicular to thickness direction DB1. The upper surfaces and the lower surfaces of insulation layers B11 to B18 constitute layer planes LP1 to LP9. Specifically, the upper surface of insulation layer B11 constitutes layer plane LP1 corresponding to the upper surface of multilayer board B1. The lower surface of insulation layer B11 is bonded to the upper surface of insulation layer B12. The lower surface of insulation layer B11 and the upper surface of insulation layer B12 coincide with each other and constitute layer plane LP2. The lower surface of insulation layer B12 is bonded to the upper surface of insulation layer B13. The lower surface of insulation layer B12 and the upper surface of insulation layer B13 coincide with each other and constitute layer plane LP3. The lower surface of insulation layer B13 is bonded to the upper surface of insulation layer B14. The lower surface of insulation layer B13 and the upper surface of insulation layer B14 coincide with each other and constitute layer plane LP4. The lower surface of insulation layer B14 is bonded to the upper surface of insulation layer B15. The lower surface of insulation layer B14 and the upper surface of insulation layer B15 coincide with each other and constitute layer plane LP5. The lower surface of insulation layer B15 is bonded to the upper surface of insulation layer B16. The lower surface of insulation layer B15 and the upper surface of insulation layer B16 coincide with each other and constitute layer plane LP6. The lower surface of insulation layer B16 is bonded to the upper surface of insulation layer B17. The lower surface of insulation layer B16 and the upper surface of insulation layer B17 coincide with each other and constitute layer plane LP7. The lower surface of insulation layer B17 is bonded to the upper surface of insulation layer B18. The lower surface of insulation layer B17 and the upper surface of insulation layer B18 coincide with each other and constitute layer plane LP8. The lower surface of insulation layer B18 constitutes layer plane LP9 corresponding to the lower surface of multilayer board B1.

Primary coil P1 is provided on at least one of insulation layers B11 to B18, and second coil S1 is provided on at least one of insulation layers B11 to B18. Each of sub coils L11, L12, sub coils L21, L22, sub coils L31, L32, and sub coils L41, L42 is provided on respective one of insulation layers B11 to B18 of multilayer board B1. Sub coils L12, L22, L32, and L42 are formed by winding conductors, such as copper foils, about coil axis CL12, CL22, CL32, or CL42, respectively, in a spiral shape in an identical direction, such as a clockwise direction viewing from above in accordance with Embodiment 1. Sub coils L11, L21, L31, and L41 are formed by winding conductors outward about coil axis CL11, CL21, CL31, and CL41, respectively, in a spiral shape in an identical direction, such as an counterclockwise direction viewing from above in accordance with Embodiment 1. The coil axis in this context refers to an axis passing through a center about which a conductor of a sub coil is wound, and extending in thickness direction DB1 (up-down direction). A point at which a layer plane containing a sub coil crosses a coil axis of the sub coil is a center of the sub coil. Each of external shapes of sub coils L11, L12, L21, L22, L31, L32, L41, and L42 is not limited to a rectangular shape illustrated in FIGS. 2A to 3D, but may be other shapes, such as a circular shape or a polygonal shape.

As illustrated in FIGS. 2A to 2D, sub coils L11, L22, L21, and L12 constituting primary coil P1 are provided on the upper surfaces of insulation layers B11, B12, B13, and B14, respectively. As illustrated in FIGS. 3A to 3D, sub coils L31, L42, L41, and L32 constituting secondary coil S1 are provided on the upper surfaces of insulation layers B15, B16, B17, and B18, respectively.

Figure 2A:
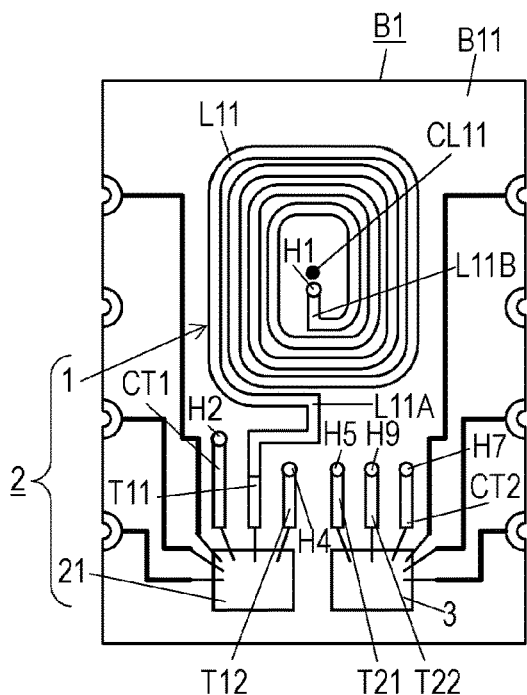
FIG. 2A is a schematic top view of an insulation layer having a primary coil of the transformer provided thereon according to Embodiment 1.

In transformer 1 in accordance with Embodiment 1, the pair of input ports T11 and T12, intermediate tap CT1, the pair of output ports T21 and T22, and intermediate tap CT2 are provided on the upper surface of insulation layer B11, as illustrated in FIG. 2A. In transformer 1, driving circuit 21 and output circuit 3 of switch power supply 2 are provided on the upper surface of insulation layer B11, as illustrated in FIG. 2A.

Figure 2B:
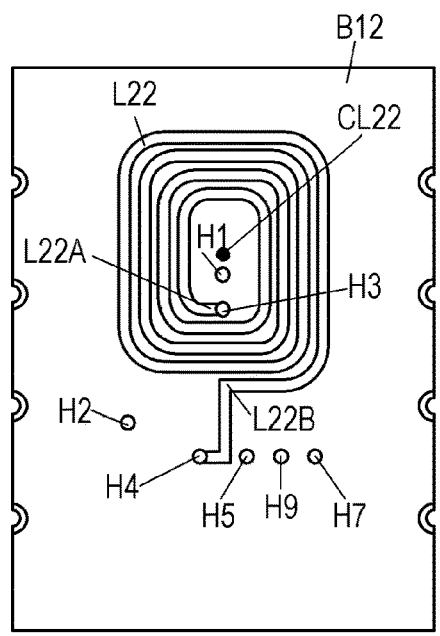
FIG. 2B is a schematic top view of an insulation layer having the primary coil of the transformer provided thereon according to Embodiment 1.

Sub coil L11 is provided on the upper surface of insulation layer B11, as illustrated in FIG. 2A. End L11A of sub coil L11 is electrically connected to input port T11 while end L11B of sub coil L11 is electrically connected to end L12A of sub coil L12 through via-conductor H1. End L11A of sub coil L11 constitutes end L1A of coil L1. As illustrated in FIG. 2D, sub coil L12 is provided on the upper surface of insulation layer B14. End L12B of sub coil L12 is electrically connected to intermediate tap CT1 through via-conductor H2. End L12B of sub coil L12 constitutes end L1B of coil L1.

Figure 2C:
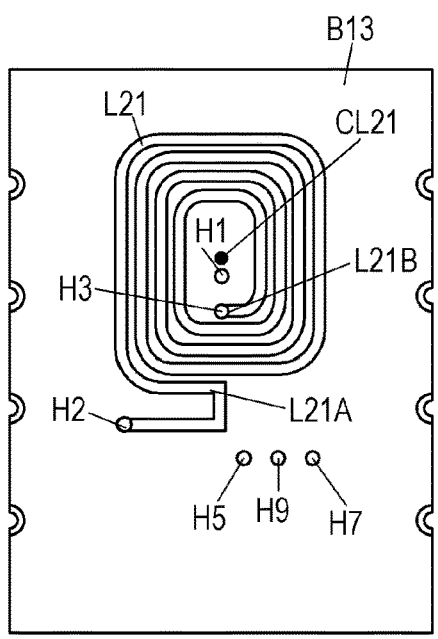
FIG. 2C is a schematic top view of an insulation layer on which the primary coil of the transformer is provided according to the first exemplary embodiment.
Figure 2D:
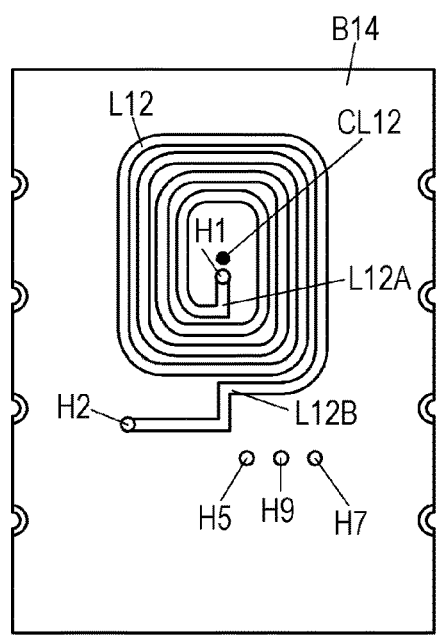
FIG. 2D is a schematic top view of an insulation layer having the primary coil of the transformer provided thereon according to Embodiment 1.

As illustrated in FIG. 2C, sub coil L21 is provided on the upper surface of insulation layer B13. End L21A of sub coil L21 is electrically connected to intermediate tap CT1 through via-conductor H2 while end L21B of sub coil L21 is electrically connected to end L22A of sub coil L22 through via-conductor H3. End L21A of sub coil L21 constitutes end L2A of coil L2. As illustrated in FIG. 2B, sub coil L22 is provided on the upper surface of insulation layer B12. End L22B of sub coil L22 is electrically connected to input port T12 through via-conductor H4. End L22B of sub coil L22 constitutes end L2B of coil L2.

Figure 3A:
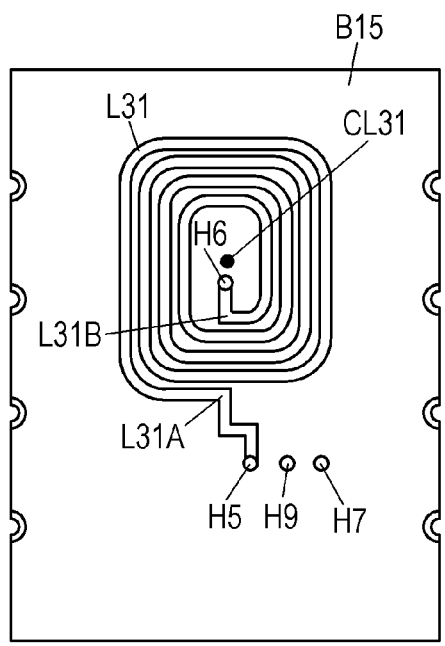
FIG. 3A is a schematic top view of an insulation layer having a secondary coil of the transformer provided thereon according to Embodiment 1.
Figure 3B:
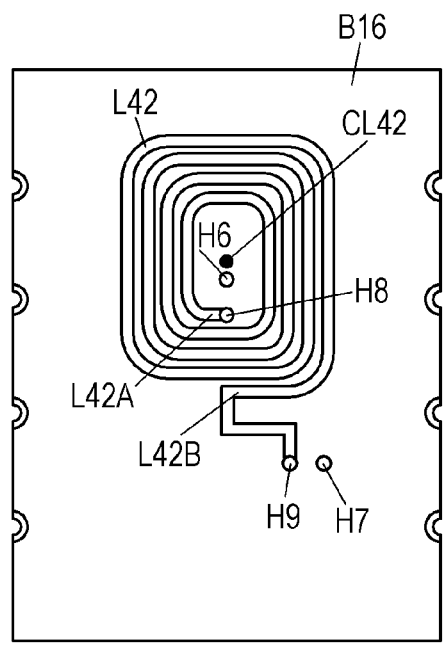
FIG. 3B is a schematic top view of an insulation layer having the secondary coil of the transformer provided thereon according to Embodiment 1.
Figure 3D:
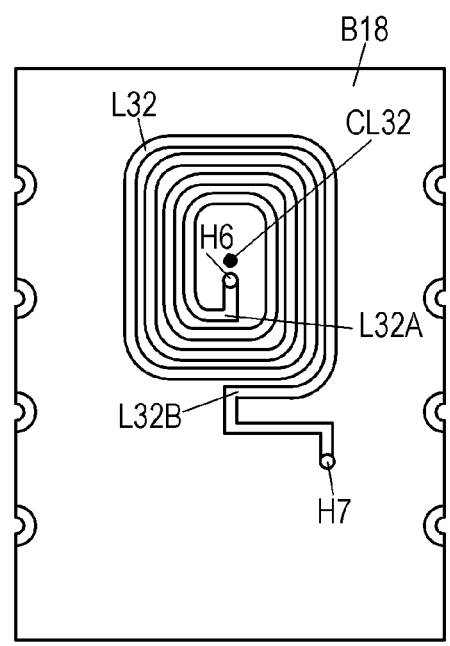
FIG. 3D is a schematic top view of an insulation layer having the secondary coil of the transformer provided thereon according to Embodiment 1.
Figure 4:
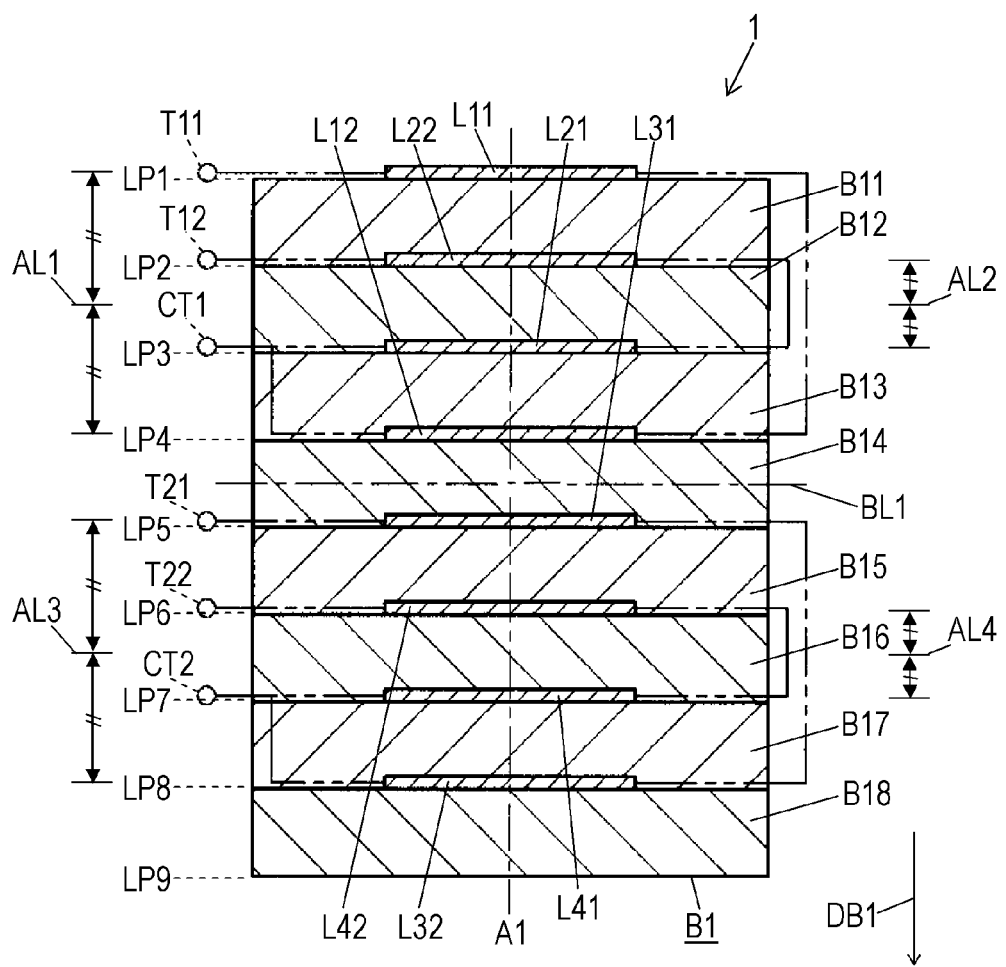
FIG. 4 is a schematic cross-sectional view of the transformer according to Embodiment 1.

As illustrated in FIG. 3A, sub coil L31 is provided on the upper surface of insulation layer B15. End L31A of sub coil L31 is electrically connected to output port T21 through via-conductor H5, while end L31B of sub coil L31 is electrically connected to end L32A of sub coil L32 through via-conductor H6. End L31A of sub coil L31 constitutes end L3A of coil L3. As illustrated in FIG. 3D, sub coil L32 is provided on the upper surface of insulation layer B18. End L32B of sub coil L32 is electrically connected to intermediate tap CT2 through via-conductor H7. End L32B of sub coil L32 constitutes end L3B of coil L3.

Figure 3C:
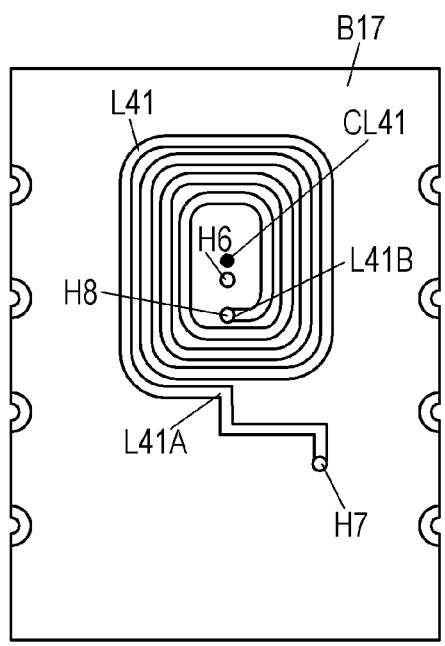
FIG. 3C is a schematic top view of an insulation layer having the secondary coil of the transformer provided thereon according to Embodiment 1.

As illustrated in FIG. 3C, sub coil L41 is provided on the upper surface of insulation layer B17. End L41A of sub coil L41 is electrically connected to intermediate tap CT2 through via-conductor H7, while end L41B of sub coil L41 is electrically connected to end L42A of sub coil L42 through via-conductor H8. End L41A of sub coil L41 constitutes end L4A of coil L4. As illustrated in FIG. 3B, sub coil L42 is provided on the upper surface of insulation layer B16. End L42B of sub coil L42 is electrically connected to output port T22 through via-conductor H9. End L42B of sub coil L42 constitutes end L4B of coil L4.

In multilayer board B1 thus constructed, sub coils L11, L12, L21, and L22 constituting primary coil P1 are disposed in an order of sub coil L11, sub coil L22, sub coil L21, and sub coil L12 from above in thickness direction DB1 (up-down direction) of multilayer board B1, as illustrated in FIG. 1B and FIG. 4. On the other hand, sub coils L31, L32, L41, and L42 constituting secondary coil S1 are disposed in an order of sub coil L31, sub coil L42, sub coil L41, and sub coil L32 from above in thickness direction DB1 of multilayer board B1 as illustrated in FIGS. 1B and 4. FIG. 1B does not show multilayer board B1.

Average position AL1 of the positions of sub coils L11 and L12 in thickness direction DB1 of multilayer board B1 is aligned with average position AL2 of the positions of sub coils L21 and L22 in thickness direction DB1 of multilayer board B1. Similarly, average position AL3 of positions of sub coils L31 and L32 in thickness direction DB1 of multilayer board B1 is aligned with average position AL4 of positions of sub coils L41 and L42 in thickness direction DB1 of multilayer board B1. The expression "aligned" in this context includes a state "almost aligned", as well as a state "completely aligned".

The state indicated by the expression "almost aligned" will be described below. In the following description, sub coil L11, for example, is expressed as a sub coil located at numeral N (L11) as counted from sub coil L12 positioned closest to secondary coil S1 among sub coils L11, L12, L22, and L22 constituting primary coil P1. In transformer 1 in accordance with Embodiment 1, sub coil L11 is located on a layer of the fourth order counted from sub coil L12, as illustrated in FIG. 4. Accordingly, N(L11)=4 is satisfied. On the other hand, sub coil L21 is located on the layer at the second order, as illustrated in FIG. 4. Accordingly, N(L21)=2 is satisfied. Similarly, N(L12)=1, and N(L22)=3 are satisfied.

In the case that primary coil P1 includes plural (p in this example) sub coils L11, L12, ..., and L1p connected to each other in series while plural (q in this example) sub coils L21, L22, ..., and L2q connected to each other in series. That is, for coil L1 including sub coils L11, L12, ..., and L1p and coil L2 including sub coils L21, L22, ..., and L2q, the situation that average position AL1 of the positions of sub coils L11 to L1p is substantially aligned with average position AL2 of the positions of sub coils L21 to L2q is satisfied if the following formula (1) is satisfied.

$$\{N(L11)+N(L12)+\ldots+N(L1p)\}/p=\{N(L21)+N(L22)+\ldots+N(L2q)\}/Lq \quad (1)$$

Transformer 1 according to Embodiment 1 satisfies conditions of p=q=2, N(L11)=4, N(L12)=1, N(L21)=2, and N(L22)=3, thus meeting formula (1).

In transformer 1 in accordance with Embodiment 1, primary coil P1 and secondary coil S1 are provided on the upper surfaces of insulation layers B11 to B18. However, primary coil P1 and secondary coil S1 may be provided on the lower surfaces of insulation layers B11 to B18.

<Structure of Switching Power Supply>

Switching power supply 2 according to Embodiment 1 will be described below. Switching power supply 2 is a so-called push-pull type insulation DC/DC converter which includes transformer 1, driving circuit 21, and output circuit 3, as illustrated in FIG. 5. External power supply PS1 constituted by a direct current power supply is electrically connected to intermediate tap CT1 of primary coil P1. In switching power supply 2, intermediate tap CT2 of secondary coil S1 is opened and is not connected to any part.

Driving circuit 21 is electrically connected to the pair of input ports T11 and T12 of primary coil P1. Driving circuit 21 includes switching element Q1, switching element Q2, capacitor C1, and control circuit 22. Each of switching element Q1 and switching element Q2 is constituted by an n-channel enhancement type metal oxide semiconductor field effect transistor (MOSFET).

A drain of switching element Q1 is electrically connected to external power supply PS1 via coil L1. A gate of switching element Q1 is electrically connected to control circuit 22. A source of switching element Q1 is electrically connected to a circuit ground. Switching element Q1 is turned on and off in accordance with a driving signal transmitted from control circuit 22 to open and close a power supply path for supplying power from external power supply PS1 to coil L1.

A drain of switching element Q2 is electrically connected to external power supply PS1 via coil L2. A gate of switching element Q2 is electrically connected to control circuit 22. A source of switching element Q2 is electrically connected to the circuit ground. Switching element Q2 is turned on and off in accordance with a driving signal transmitted from control circuit 22 to open and close a power supply path for supplying power from external power supply PS1 to coil L2. Each of switching element Q1 and switching element Q2 may be constituted by, e.g. a bipolar transistor or an insulated gate bipolar transistor (IGBT).

Control circuit 22 is implemented by, e.g. a microcomputer. Control circuit 22 supplies driving signals to switching element Q1 and switching element Q2 to alternately turn on and off switching elements Q1 and Q2. In other words, control circuit 22 alternately drives coils L1 and L2 of primary coil P1.

Output circuit 3 is electrically connected to the pair of output ports T21 and T22 of secondary coil S1. Output circuit 3 includes capacitor C2, rectifier circuit 31, and low drop-out (LDO) regulator 32. Rectifier circuit 31 includes capacitor C3 and four diodes D1 to D4 constituting a diode bridge. An anode of diode D1 and a cathode of diode D3 are connected to output port T21 of transformer 1. An anode of diode D2 and a cathode of diode D4 are connected to output port T22 of transformer 1. A cathode of diode D1 and a cathode of diode D2 are connected to electrode C3A of capacitor C3. An anode of diode D3 and an anode of diode D4 are connected to electrode C3B of capacitor C3. Diodes D1 to D4 full-wave rectify a voltage output from secondary coil S1 of transformer 1. Capacitor C3 smooths a pulsating voltage output from diodes D1 to D4. Low drop-out regulator 32 reduces a difference between a voltage input from the input port (both-end voltage of capacitor C3) and a voltage output from the output port.

Capacitor C1 is electrically connected to primary coil P1 in parallel. Capacitor C1 and primary coil P1 constitute a resonant circuit on a primary side. Capacitor C2 is electrically connected to secondary coil S1 in parallel. Capacitor C2 and secondary coil S1 constitute a resonant circuit on a secondary side.

Switching power supply 2 alternately drives coils L1 and L2 of primary coil P1 to output, to the secondary side of transformer 1, a voltage corresponding to a power supply voltage of external power supply PS1 input to the primary side of transformer 1.

Switching power supply 2 according to Embodiment 1 may not necessarily include output circuit 3. Switching power supply 2 according to Embodiment 1 includes at least transformer 1, switching element Q1, switching element Q2, and control circuit 22. Switching power supply 2 according to Embodiment 1 has at least a function of transmitting power from the primary side of transformer 1. Switching power supply 2 therefore may be implemented by, e.g. a bi-directional switching power supply which also has a function of transmitting power from the secondary side of transformer 1.

<Comparative Example>

Figure 7:
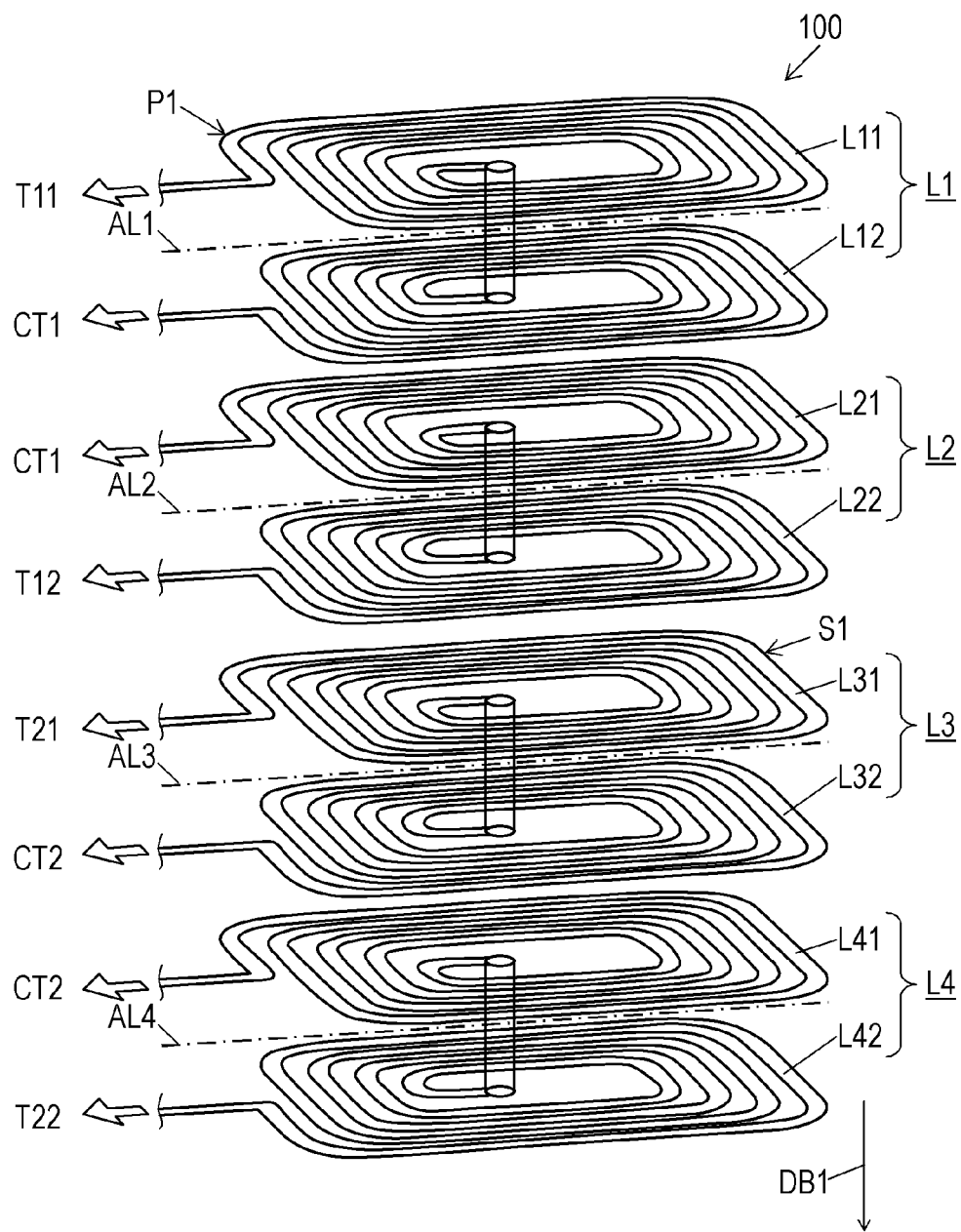
FIG. 7 is a schematic diagram of a comparative example of a transformer for illustrating an arrangement of coils of the transformer.

FIG. 7 is a schematic diagram of a comparative example of transformer 100 for illustrating an arrangement of coils L1 to L4. The comparative example illustrated in FIG. 7 will be described below in conjunction with transformer 1 illustrated in FIGS. 1A and 1B. FIG. 7 schematically illustrates an arrangement of the coils of the comparative example of the transformer. In the comparative example of transformer 100, primary coil P1 includes sub coil L11, sub coil L12, sub coil L21, and sub coil L22 in this order from above in thickness direction DB1 (up-down direction) of multilayer substrate B1, as illustrated in FIG. 7. On the other hand, secondary coil S1 includes sub coil L31, sub coil L32, sub coil L41, and sub coil L42 in this order from above in thickness direction DB1 of multilayer substrate B1, as illustrated in FIG. 7. FIG. 7 does not show multilayer board B1.

In the comparative example of transformer 100, average position AL1 of the positions of sub coils L11 and L12 in thickness direction DB1 of multilayer board B1 is not aligned with average position AL2 of the positions of sub coils L21 and L22 in thickness direction DB1 of multilayer board B1. In this case, a coupling coefficient between coil L1 and secondary coil S1 is different from a coupling coefficient between coil L2 and secondary coil S1, thereby producing non-uniform coupling coefficients in the comparative example of transformer 100. As a result, an output voltage induced by secondary coil S1 in response to driving of coil L1 is different from an output voltage induced by secondary coil S1 in response to driving of coil L2, thereby producing non-uniform output voltages. Accordingly, the comparative example of transformer 100 may cause an output voltage drop on the secondary side, accordingly lowering power conversion efficiency.

In the conventional transformer disclosed in PTL 1, clearances between plural coils constituting the primary coil and plural coils constituting the secondary coil are not uniform. This structure may cause an output voltage drop on the second side, accordingly lowering power conversion efficiency.

<Advantageous Effects>

In transformer 1 in accordance with Embodiment 1, average position AL1 of the positions of sub coils L11 and L12 in thickness direction DB1 (up-down direction) of multilayer board B1 is aligned with average position AL2 of the positions of sub coils L21 and L22 in thickness direction DB1 of multilayer board B1. In this case, a coupling coefficient between coil L1 and secondary coil S1 of transformer 1 in accordance with Embodiment 1 is equal to a coupling coefficient between coil L2 and secondary coil S1 of transformer 1, thereby producing uniform coupling coefficients. As a result, an output voltage induced by secondary coil S1 in response to driving of coil L1 is equal to an output voltage induced by secondary coil S1 in response to driving of coil L2, thereby producing a uniform output voltages. Accordingly, transformer 1 in accordance with Embodiment 1 prevents an output voltage drop on the secondary side and lowering of power conversion efficiency. Moreover, transformer 1 generating a uniform output voltage on the secondary side prevents an excessive voltage from being generated, thus reducing noise of the output voltage on the secondary side.

In transformer 1 in accordance with Embodiment 1, coil L1 and coil L2 are electrically connected to intermediate tap CT1 of primary coil P1, as illustrated in FIGS. 1A, 1B, and 4. Each of sub coils L11 and L12 faces respective one of sub coils L21 and L22 which is disposed at the same position at a connection order counted from intermediate tap CT1 in thickness direction DB1 (up-down direction) of multilayer board B1. For example, sub coil L12 out of sub coils L11 and L12 which is disposed at the first order counted from intermediate tap CT1 faces, across insulation layer B13, sub coil L21 out of sub coils L21 and L22 which is disposed at the first order counted from intermediate tap CT1. No sub coil is disposed between sub coils L12 and L21. Sub coil L11 out of sub coils L11 and L12 which is disposed at the second order counted from intermediate tap CT1 faces, across insulation layer B11, sub coil L22 out of sub coils L21 and L22 which is disposed at the second order counted from intermediate tap CT1. No sub coil is disposed between sub coils L11 and L22.

As described above, coil L1 includes sub coils L11, L12, . . . , and L1$p$ connected to each other in series while coil L2 includes sub coils L21, L22, . . . , and L2$q$. Sub coil L1$n$ (where n is a natural number equal to or smaller than p and equal to or smaller than q) out of sub coils L11, L12, . . . , and L1$p$ which is connected in series at the n-th order counted from intermediate tap CT1 faces, in thickness direction DB1, sub coil L2$n$ out of sub coils L21, L22, . . . , and L2$q$ which is connected in series at the n-th order counted from the intermediate tap.

This configuration increases relative positional accuracy of coil L2 with respect to coil L1, effectively reduces a voltage drop of secondary coil S1 and a lowering of power conversion efficiency. This configuration may be arbitrarily applied.

In transformer 1 in accordance with Embodiment 1, coil axes CL11 and CL12 of sub coils L11 and L12 and coil axes CL21 and CL22 of sub coils L21 and L22 are disposed on axis A1 (see FIG. 4) extending in thickness direction DB1 (up-down direction) of multilayer board B1. This configuration decreases an area necessary for forming sub coils L11, L12, L21, and L22 on multilayer board B1, accordingly decreasing a mounting area of multilayer board B1, reducing the size and cost. This configuration may be arbitrarily applied.

In transformer 1 in accordance with Embodiment 1, sub coils L11 and L12 are disposed in thickness direction DB1 (the up-down direction) of multilayer board B1 as to be located on two layer planes LP1 and LP4 out of layer planes LP1 to LP9 different from each other, respectively (see FIG. 4). Similarly, sub coils L21 and L22 are disposed in thickness direction DB1 of multilayer board B1 as to be located on two layer planes LP3 and LP2 out of layer planes LP1 to LP9 different from each other, respectively (see FIG. 4). This configuration decreases the mounting area of multilayer board B1 similarly to the configuration described above, reducing the size and cost. This configuration may be arbitrarily applied.

In transformer 1 in accordance with Embodiment 1, secondary coil S1 has a structure similar to the structure of primary coil P1. Secondary coil S1 includes coils L3 and L4 connected in series to each other. Coil L3 includes plural (two in this example) sub coils L31 and L32 electrically connected in series to each other similarly to coil L1. Coil L4 includes plural (two in this example) sub coils L41 and L42 electrically connected in series to each other similarly to coil L2.

Coil L3 and coil L4 are arranged symmetrically to coil L1 and coil L2 in thickness direction DB1 (up-down direction) of multilayer board B1. More specifically, coils L3 and L1 are arranged symmetrically to each other with respect to boundary line BL1 separating primary coil P1 from secondary coil S1, as illustrated in FIG. 1B. In this case, sub coils L31 and L32 are arranged symmetrically to sub coils L11 and L12 with respect to boundary line BL1, respectively. Coils L4 and L2 are arranged symmetrically with respect to boundary line BL1. In this case, sub coils L41 and L42 are arranged symmetrically to sub coils L21 and L22 with respect to boundary line BL1, respectively.

Average position AL3 of the positions of sub coils L31 and L32 in thickness direction DB1 of multilayer board B1 is aligned with average position AL4 of the positions of sub coils L41 and L42 in thickness direction DB1. In this case, a coupling coefficient between coil L1 and coil L3, a coupling coefficient between coil L1 and coil L4, a coupling coefficient between coil L2 and coil L3, and a coupling coefficient between coil L2 and coil L4 become equivalent to one another, thereby producing uniform coupling coefficients, unlike the comparative example of transformer 100. As a result, an output voltage induced by secondary coil S1 in response to driving of coil L1 easily becomes equivalent to an output voltage induced by secondary coil S1 in response to driving of coil L2 of transformer 1, thus reducing an output voltage drop of secondary coil S1, and a lowering of power conversion efficiency.

This structure of secondary coil S1 may be arbitrarily applied. In addition, coil L3 and coil L4 of secondary coil S1 may be arbitrarily added.

Figure 8A:
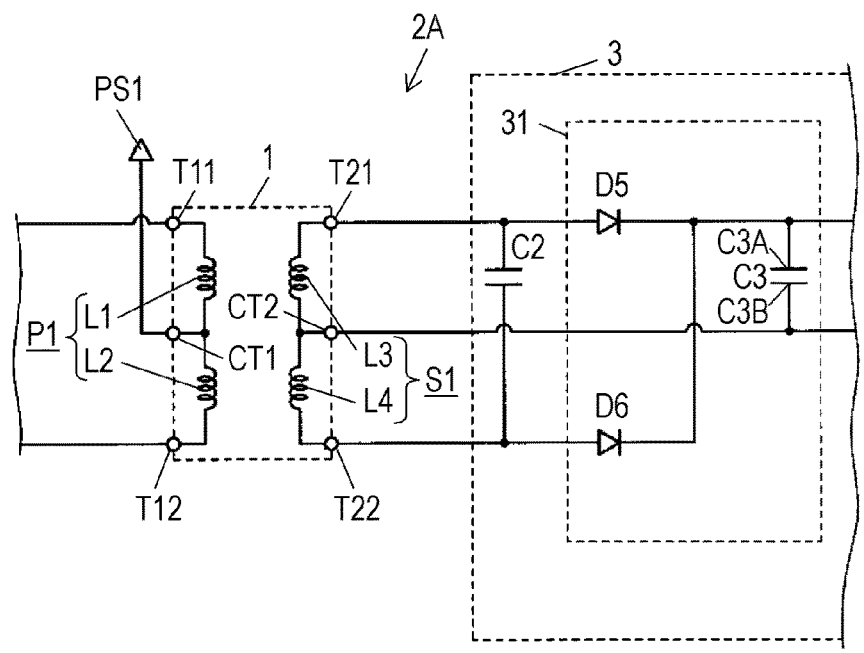
FIG. 8A is a schematic circuit diagram of another switching power supply according to Embodiment 1.

FIG. 8A is a schematic circuit diagram of another switching power supply 2A according to Embodiment 1. In FIG. 8A, components identical to those of switching power supply 2 illustrated in FIG. 5 are denoted by the same reference numerals. In transformer 1 in accordance with Embodiment 1, secondary coil S1 includes coil L3 and coil L4 as illustrated in FIGS. 1A and 1B. Coil L3 and coil L4 are electrically connected in series to each other at intermediate tap CT2 of secondary coil S1. Transformer 1 may be incorporated in, e.g. switching power supply 2A illustrated in FIG. 8A.

In switching power supply 2A illustrated in FIG. 8A, rectifier circuit 31 includes diodes D5 and D6 instead of diodes D1 to D4 constituting the diode bridge of switching power supply 2 illustrated in FIG. 5. An anode of diode D5 is electrically connected to output port T21 of secondary coil S1 while a cathode of diode D5 is electrically connected to electrode C3A of capacitor C3. An anode of diode D6 is electrically connected to output port T22 of secondary coil S1 while a cathode of diode D6 is electrically connected to electrode C3B of capacitor C3. Intermediate tap CT2 of secondary coil S1 is electrically connected to electrode C3B of capacitor C3.

Rectifier circuit 31 thus constructed rectifies a voltage output from secondary coil S1 of transformer 1 with diodes D5 and D6. Moreover, rectifier circuit 31 smooths a pulsating voltage output from diodes D5 and D6 with capacitor C3, and outputs the smoothed voltage.

Figure 8B:
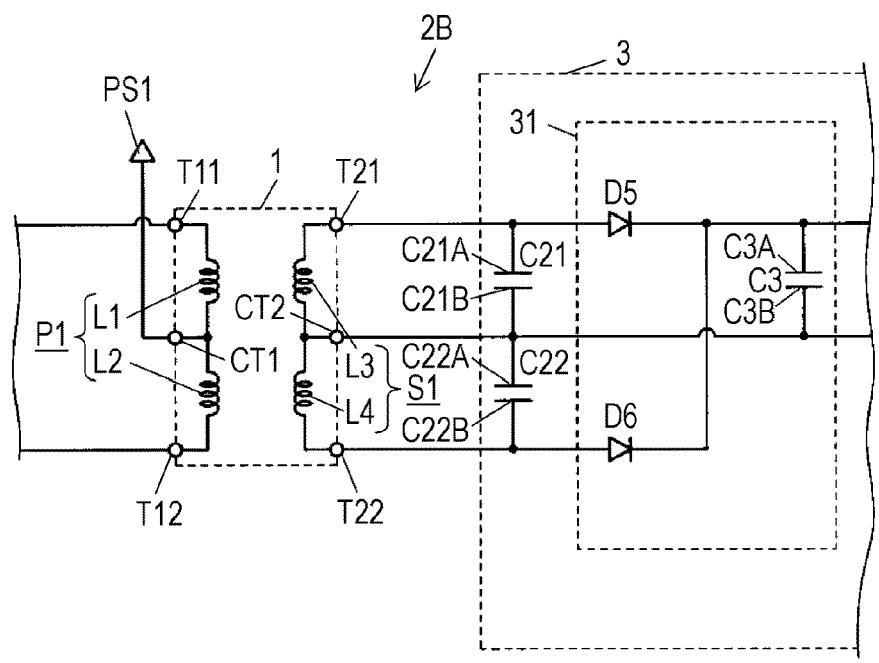
FIG. 8B is a schematic circuit diagram of still another switching power supply according to Embodiment 1.

FIG. 8B is a schematic circuit diagram of still another switching power supply 2B according to Embodiment 1. In FIG. 8B, components identical to those of switching power supply 2A shown in FIG. 8A are denoted bye the same reference numerals. Transformer 1 according to Embodiment 1 may also be incorporated in switching power supply 2B illustrated in FIG. 8B. Switching power supply 2B illustrated in FIG. 8B includes a series circuit including capacitors C21 and C22 connected in series to each other, instead of capacitor C2 of switching power supply 2A illustrated in FIG. 8A.

Electrode C21A of capacitor C21 is electrically connected to output port T21 of secondary coil S1 while electrode C21B of capacitor C21 is electrically connected to intermediate tap CT2 of secondary coil S1. Electrode C22A of capacitor C22 is electrically connected to intermediate tap CT2 of secondary coil S1 while electrode C22B of capacitor C22 is electrically connected to output port T22 of secondary coil S1.

In switching power supply 2B illustrated in FIG. 8B, a ripple of an output voltage induced by secondary coil S1 can decrease more than switching power supply 2 illustrated in FIG. 8A, thus reducing noise.

<Structure of Isolator>

As illustrated in FIGS. 6A and 6B, isolator 4 according to Embodiment 1 includes switching power supply 2, isolation circuit 5, and signal processing circuit 6. In isolator 4, switching power supply 2, isolation circuit 5, and signal processing circuit 6 are mounted on multilayer board B1. Isolation circuit 5 may be provided on a surface, such as an upper surface, of multilayer board B1, or inside multilayer board B1.

Isolation circuit 5 is configured to electrically isolate an input signal input to the primary side from output signals output to the secondary side in response to the input signals. Isolation circuit 5 is configured to electrically isolate the primary side from the secondary side by magnetic coupling which uses, e.g. a micro coil formed by a semiconductor process. Isolation circuit 5 may be configured to electrically isolate the primary side from the secondary side by capacitive coupling which uses, e.g. a capacitor. Alternatively, isolation circuit 5 may be configured to electrically isolate the primary side from the secondary side by optical coupling which uses, e.g. a photo-coupler.

Signal processing circuit 6 includes primary side processing circuit 61, and secondary side processing circuit 62. Processing circuit 61 processes input signals input to three input terminals 611 to 613, and outputs the processed signals to isolation circuit 5. The input signals in this example are digital signals. Each of input terminals 611 to 613 is implemented a land provided on multilayer board B1. In isolator 4 in accordance with Embodiment 1, driving circuit 21 of is included in signal processing circuit 6 (processing circuit 61) as indicated by a broken line in FIG. 6A. However, other structures may be adopted. More specifically, driving circuit 21 and signal processing circuit 6 may be separately provided.

Processing circuit 62 processes signals transmitted from processing circuit 61 via isolation circuit 5, and outputs the processed signals to three output terminals 621 to 623 as output signals. The output signals are output to output terminals 621 to 623 in correspondence with input signals input to input terminals 611 to 613, respectively. The output signals in this example are digital signals. Each of output terminals 621 to 623 is a land provided on multilayer board B1. In isolator 4 in accordance with Embodiment 1, output circuit 3 is included in signal processing circuit 6 (processing circuit 62) as indicated by a broken line in FIG. 6A. However, other structures may be adopted. More specifically, output circuit 3 and signal processing circuit 6 may be separately provided. Processing circuit 62 may be configured to receive operation power from an external power supply, or may be configured to directly receive output power from the secondary side of transformer 1 as the operation power.

In isolator 4 in accordance with Embodiment 1, transformer 1 is provided on an area X1 (see FIG. 6B) of multilayer board B1. Driving circuit 21, isolation circuit 5, and signal processing circuit 6 of isolator 4 are mounted on an area X2 (see FIG. 6B) of multilayer board B1. The upper surface (layer plane LP1) of multilayer board B1 is covered with sealing material 41 made of isolation resin material, such as epoxy resin, for protecting circuits, such as driving circuit 21 and isolation circuit 5, and electrical isolation between circuits on the primary side and circuits on the secondary side mounted on the upper surface of multilayer board B1.

As described above, in isolator 4 in accordance with Embodiment 1, an isolator for communication including isolation circuit 5 and signal processing circuit 6, and switching power supply 2 including transformer 1 for power transmission are formed integrally with each other on single multilayer board B1. Accordingly, isolator 4 in accordance with Embodiment 1 has a small size and prevents the lowering of power conversion efficiency due to switching power supply 2.

Isolator 4 according to Embodiment 1 is configured to output, to the secondary side electrically isolated, digital signals input to the isolator. However, other structures may be adopted. For example, isolator 4 according to Embodiment 1 may be configured to output, to the secondary side electrically isolated, analog signals input to the isolator.

Exemplary Embodiment 2

Figure 9:
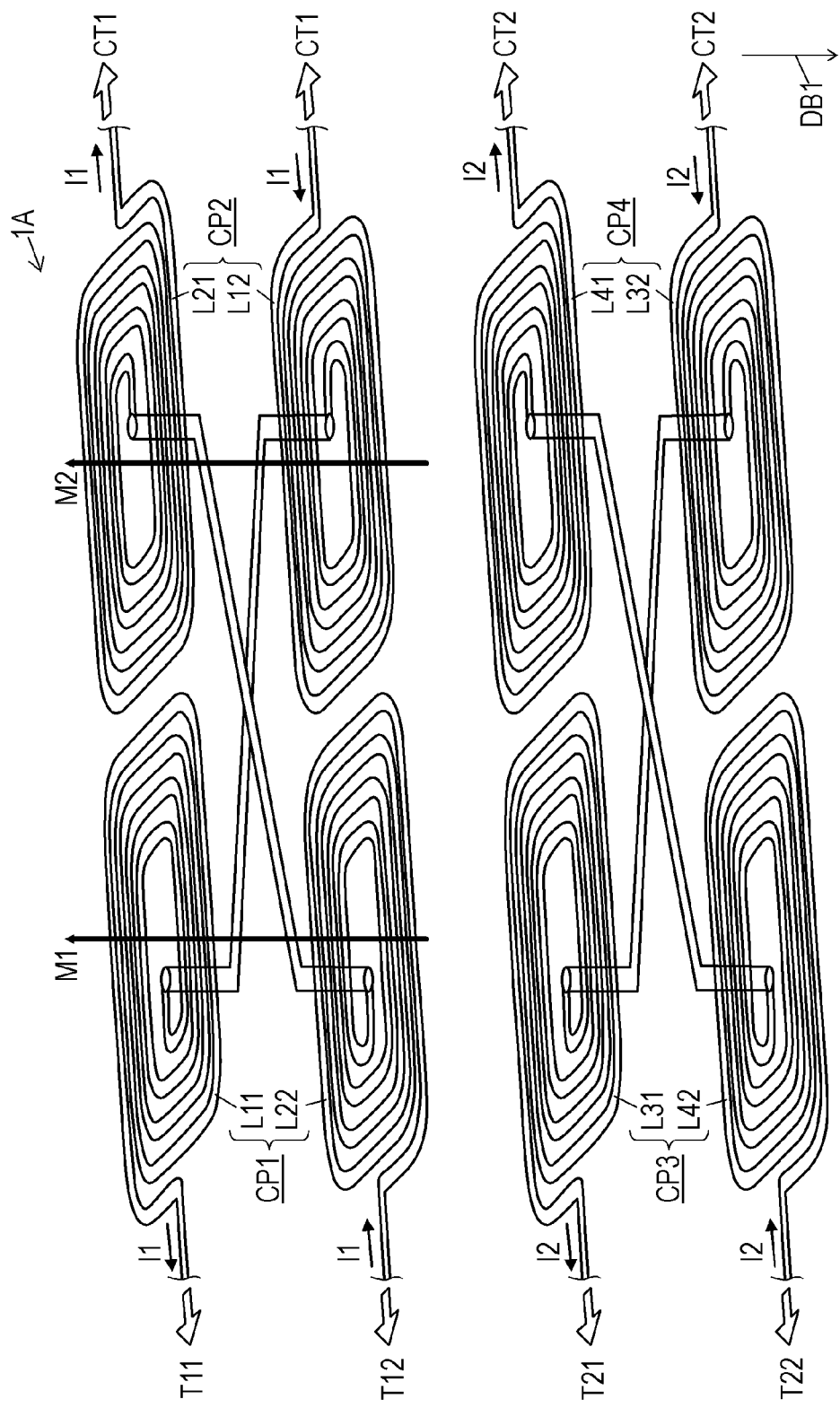
FIG. 9 is a schematic diagram of a transformer according to Exemplary Embodiment 2 for illustrating an arrangement of coils of the transformer.
Figure 10:
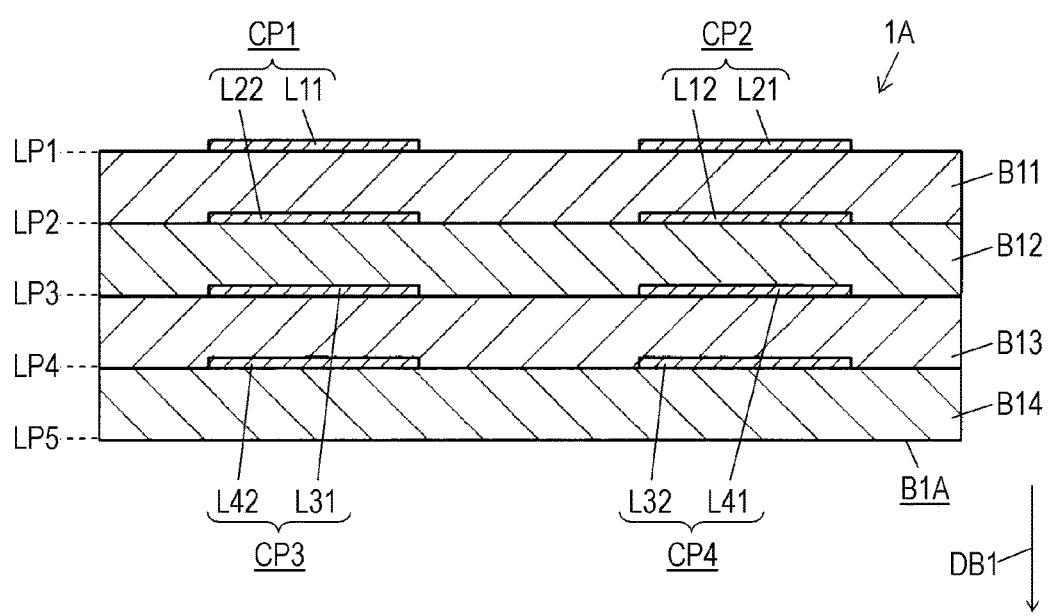
FIG. 10 is a schematic cross-sectional view of a multilayer board of the transformer according to Embodiment 2.

FIG. 9 is a schematic diagram of transformer 1A according to Exemplary Embodiment 2 for illustrating an arrangement of sub coils of transformer 1A. FIG. 10 is a schematic cross-sectional view of multilayer board B1A of transformer 1A. In FIGS. 9 and 10, components identical to those of transformer 1 in accordance with Embodiment 1 illustrated in FIGS. 1A and 1B are denoted bye the same reference numerals.

Transformer 1A according to Embodiment 2 includes multilayer board B1A instead of multilayer board B1 of the transformer in accordance with Embodiment 1 illustrated in FIG. 4. Multilayer board B1A includes insulation layers B11 to B14 of multilayer board B1 according to Embodiment 1. Upper surfaces and lower surfaces of insulation layers B11 to B14 of multilayer board B1A constitute layer planes LP1 to LP5, similarly to multilayer board B1 in accordance with Embodiment 1. In multilayer board B1A, a lower surface of insulation layer B14 constitutes layer plane LP5.

In transformer 1A in accordance with Embodiment 2, plural (four in this example) coil pairs CP1 to CP4 including a pair of sub coils L11 and L12, a pair of sub coils L21 and L22, a pair of sub coils L31 and L32, and a pair of L41 and L42, respectively, as illustrated in FIGS. 9 and 10. Coil pairs CP1 and CP2 are configured such that plural (two in this example) sub coils L11 and L12 face plural (two in this example) sub coils L21 and L22 in thickness direction DB1 (up-down direction) of multilayer board B1A, respectively. Coil pairs CP3 and CP4 are configured such that plural (two in this example) sub coils L31 and L32 face plural (two in this example) sub coils L41 and L42 in thickness direction DB1 of multilayer board B1A, respectively.

More specifically, sub coil L11 provided on the upper surface of insulation layer B11 faces sub coil L22 provided on the upper surface of insulation layer B12 across insulation layer B11 in thickness direction DB1 to constitute coil pair CP1 with sub coil L22. No sub coil is provided between sub coils L11 and L22. Sub coil L21 provided on the upper surface of insulation layer B11 faces sub coil L12 provided on the upper surface of insulation layer B12 across insulation layer B11 in thickness direction DB1 to constitute coil pair CP2 with sub coil L12. No sub coil is provided between sub coils L12 and L21. Sub coil L31 provided on the upper surface of insulation layer B13 faces sub coil L42 provided on the upper surface of insulation layer B14 across insulation layer B13 in thickness direction DB1 to constitute coil pair CP3 with sub coil L42. No sub coil is provided between sub coils L31 and L42. Sub coil L41 provided on the upper surface of insulation layer B13 faces sub coil L32 provided on the upper surface of insulation layer B14 across insulation layer B13 in thickness direction DB1 to constitute coil pair CP4 with sub coil L32. No sub coil is provided between sub coils L32 and L41.

An operation of transformer 1A according to Embodiment 2 will be described below. When current I1 flows in primary coil P1 from input port T12 toward input port T11, magnetic flux M1 and magnetic flux M2 are generated in coil pair CP1 and coil pair CP2, respectively, as illustrated in FIG. 9. Magnetic flux M1 acts mainly on coil pair CP3 facing coil pair CP1 across insulation layer B12 in thickness direction DB1. Magnetic flux M2 acts mainly on coil pair CP4 facing coil pair CP2 via insulation layer B12 in thickness direction DB1. Accordingly, current I2 induced by magnetic fluxes M1 and M2 flow in secondary coil S1 from output port T22 toward output port T21.

In transformer 1A in accordance with Embodiment 2, plural coil pairs CP1 and CP2 are disposed in parallel along a surface (upper surface) of multilayer board B1A, i.e., layer planes LP1 to LP5. Similarly, plural coil pairs CP3 and CP4 are disposed in parallel along a surface (upper surface) of multilayer board B1, i.e., layer planes LP1 to LP5. In transformer 1A in accordance with Embodiment 2, the number of insulation layers on which primary coil P1 and secondary coil 51 are provided becomes smaller than the number of transformer 1 in accordance with Embodiment 1. More specifically, the number of insulation layers on which primary coil P1 and secondary coil 51 are provided is eight in transformer 1 according to Embodiment 1 (see FIG. 4) while the number of insulation layers of transformer 1A according to Embodiment 2 is four (see FIG. 10). Accordingly, a length of multilayer board B1A in thickness direction DB1 of transformer 1A according to Embodiment 2 becomes smaller than the length of transformer 1 according to Embodiment 1. In transformer 1A in accordance with Embodiment 2, multilayer board B1A may include an insulation layer on which no coil is provided. In this case, a wiring connecting coils provided on different layer planes of multilayer board B1A may be formed on a layer plane of the layer on which no coil is provided.

In transformer 1A in accordance with Embodiment 2, secondary coil S1 also includes plural coil pairs CP3 and CP4. Plural coil pairs CP3 and CP4 of secondary coil S1 may not necessarily be disposed in parallel along the layer planes as long as at least coil pairs CP1 and CP2 constituting primary coil P1 are disposed in parallel along one surface (upper surface) of multilayer board B1A, i.e., along layer planes LP1 to LP5.

Figure 11:
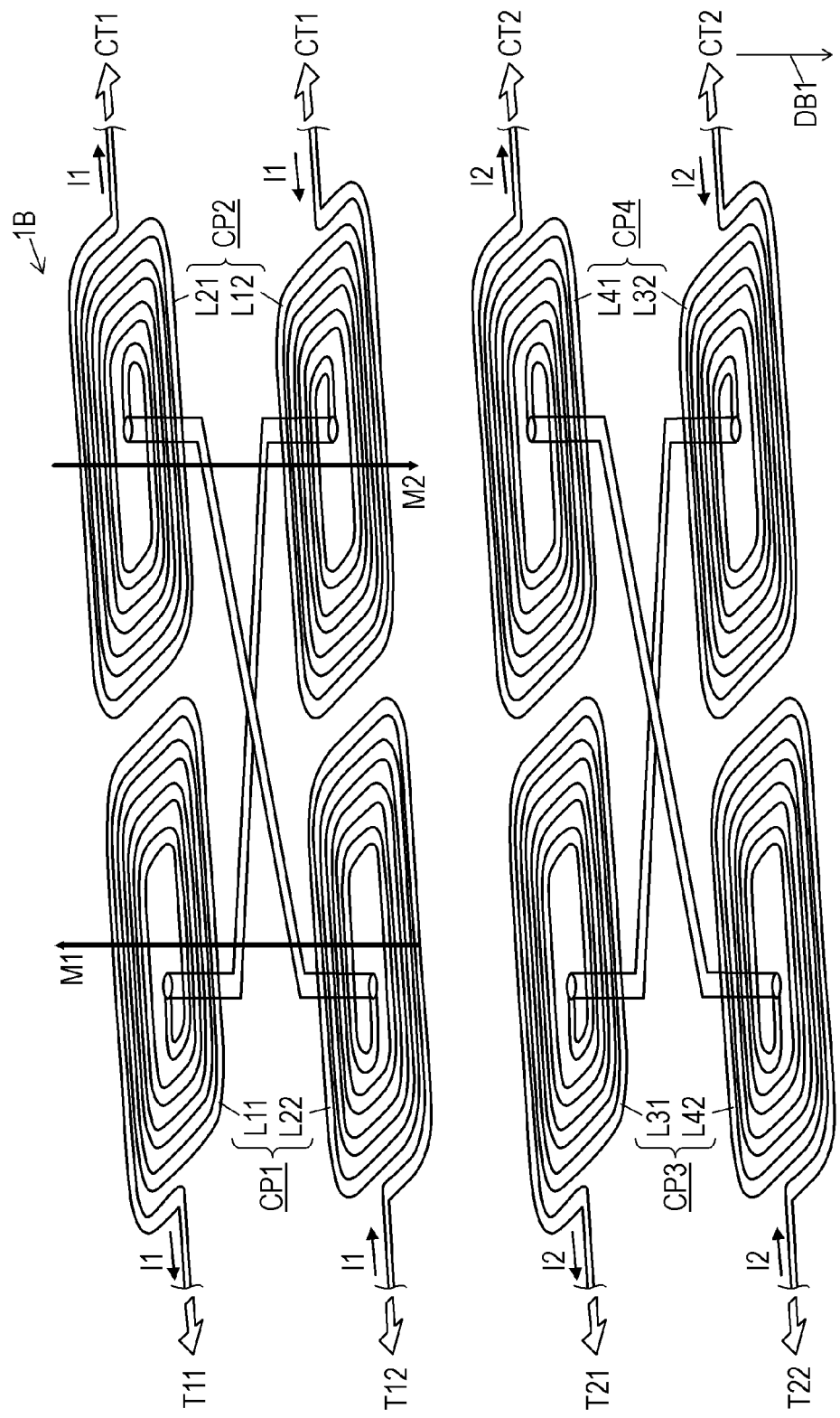
FIG. 11 is a schematic diagram of another transformer according to Embodiment 2 for illustrating an arrangement of coils of the transformer.

FIG. 11 is a schematic diagram of another transformer 1B according to Embodiment 2 for illustrating an arrangement of sub coils. In FIG. 11, components identical to those of transformer 1A illustrated in FIGS. 9 and 10 are denoted by the same reference numerals. In transformer 1B illustrated in FIG. 11, sub coils out of sub coils L11, L12, L21, and L22 disposed in parallel along a surface (upper surface) of multilayer board B1A, i.e., along layer planes LP1 to LP5, generate magnetic fluxes having directions opposite to each other along thickness direction DB1. Magnetic fluxes passing through centers of sub coils out of sub coils L11, L12, L21, and L22 of primary coil P1 disposed in parallel along a surface (layer planes LP1 to LP5) of multilayer board B1A have directions opposite to each other along thickness direction DB1 (up-down direction) of multilayer board B1A. More specifically, coil pair CP1 including sub coils L11 and L22 generates magnetic flux M1 while coil pair CP2 including sub coils L12 and L21 generates magnetic flux M2. Magnetic flux M1 at the center of sub coil L11 has a direction opposite to a direction of magnetic flux M2 at the center of sub coil L21 disposed in parallel with sub coil L11 along layer planes LP1 to LP5. Magnetic flux M1 at the center of sub coil L22 has a direction opposite to a direction of magnetic flux M2 at the center of sub coil L12 disposed in parallel with sub coil L22 along layer planes LP1 to LP5. Accordingly, magnetic flux M1 at the center of coil pair CP1 has a direction opposite to a direction of magnetic flux M2 at the center of coil pair CP2 disposed in parallel with coil pair CP1 along layer planes LP1 to LP5. Magnetic flux M1 at the center of sub coil L11 has a direction opposite to the direction of magnetic flux M2 at the center of sub coil L12. Magnetic flux M1 at the center of sub coil L21 has a direction opposite to the direction of magnetic flux M2 at the center of sub coil L22.

More specifically, sub coil L11 is made of a conductor wound clockwise viewing from above while sub coil L12 is made of a conductor would counterclockwise viewing from above. Similarly, sub coils L21 and L22 are made of conductors would in directions opposite to each other viewing from above. Sub coil L31 is made of a conductor wound clockwise viewing from above while sub coil L32 is made of a conductor wound counterclockwise viewing from above. Similarly, sub coils L41 and L42 are made of conductors would in directions opposite to each other viewing from above.

In this structure, when current I1 flows in primary coil P1 from input port T12 toward input port T11, for example, magnetic flux M1 passing through the center of sub coil L11 has a direction opposite to a direction of magnetic flux M2 passing through the center of sub coil L12, as illustrated in FIG. 11. Accordingly, magnetic fluxes M1 and M2 radiated from transformer 1B to a position away from transformer 1B in this structure cancel each other and reduce unnecessary radiation.

Figure 12:
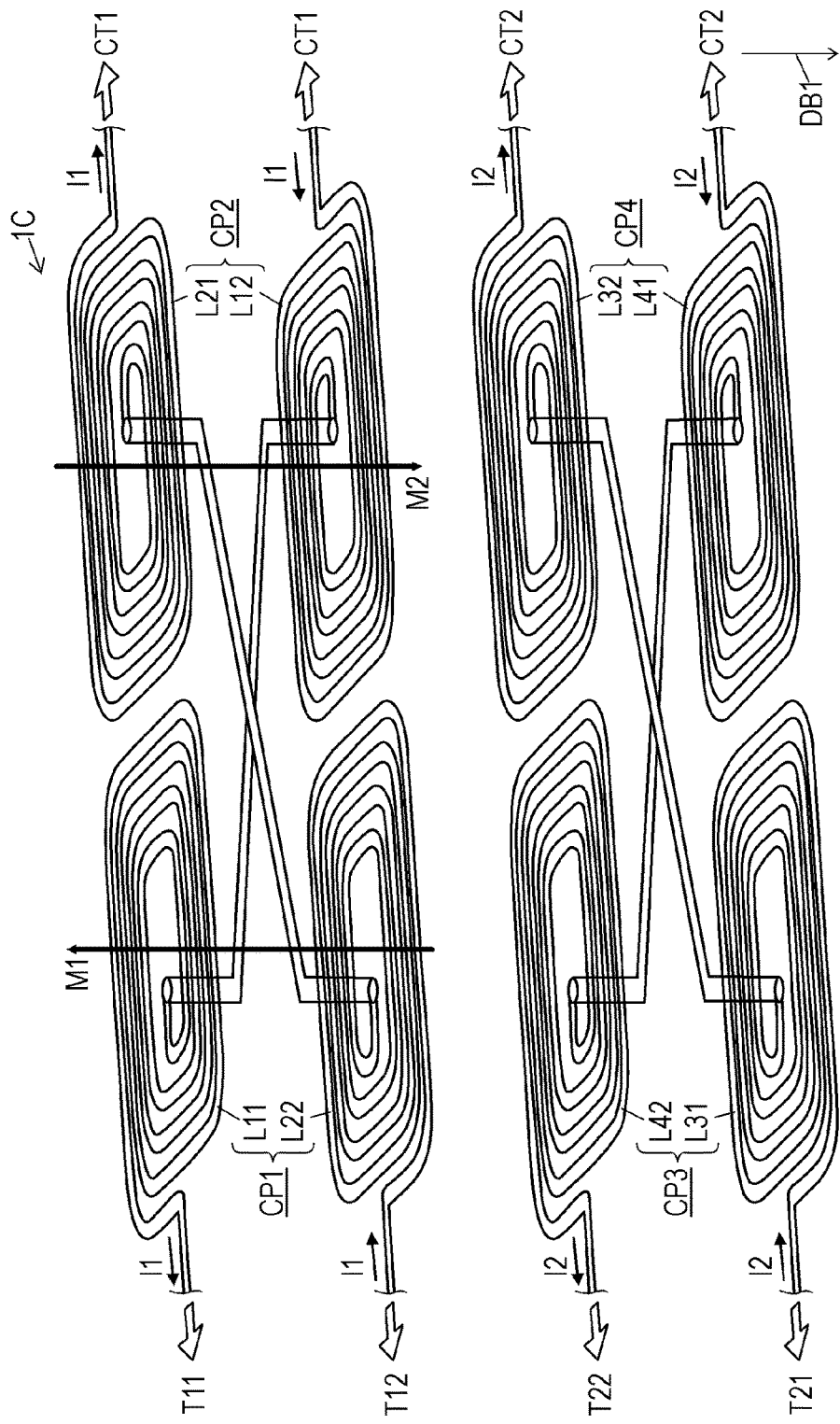
FIG. 12 is a schematic diagram of still another transformer according to Embodiment 2 for illustrating an arrangement of coils of the transformer.

FIG. 12 is a schematic diagram of still another transformer 1C according to Embodiment 2 for illustrating an arrangement of sub coils. In FIG. 12, components identical to those of transformer 1B illustrated in FIG. 11 are denoted by the same reference numerals. In transformer 1C illustrated in FIG. 12, output ports T21 and T22 are replaced with each other with respect to transformer 1B illustrated in FIG. 11. In this structure, sub coil L42 and sub coil L32 are provided on the upper surface of insulation layer B13 (layer plane LP3 illustrated in FIG. 10) while sub coils L31 and sub coils L41 are provided on the upper surface of insulation layer B14 (layer plane LP4 illustrated in FIG. 10).

Figure 13:
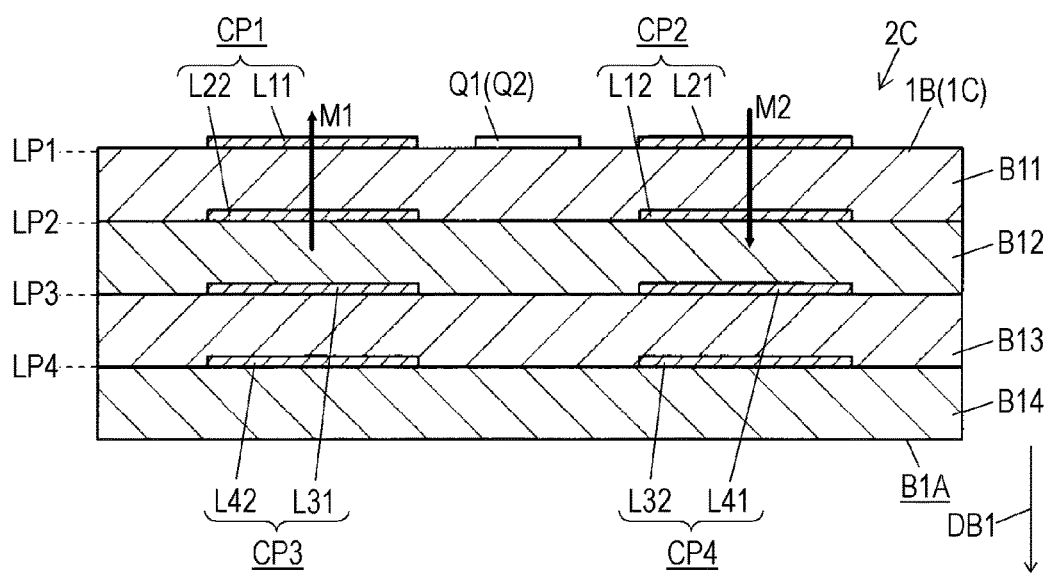
FIG. 13 is a schematic cross-sectional view of a switching power supply according to Embodiment 2.

FIG. 13 is a schematic cross-sectional view of switching power supply 2C according to Embodiment 2. In FIG. 13, components identical to those of switching power supply 2 according to Embodiment 1 illustrated in FIG. 5 are denoted by the same reference numerals. In switching power supply 2C including transformer 1B (1C) in accordance with Embodiment 2, switching elements Q1 and Q2 are disposed between sub coils out of sub coils L11, L12, L21, and L22 of primary coil P1 disposed adjacent to each other in parallel along the surface (upper surface) of multilayer board B1A, i.e., layer planes LP1 to LP5. In switching power supply 2C illustrated in FIG. 13, switching elements Q1 and Q2 are disposed between sub coils L11 and L21 adjacent to each other on the upper surface (layer plane LP1) of insulation layer B11.

In this structure, each of magnetic flux M1 and magnetic flux M2 has directions opposite to each other at positions of switching elements Q1 and Q2. Accordingly, magnetic fluxes M1 and M2 at the positions of switching elements Q1 and Q2 in this structure cancel each other, and reduce unnecessary radiation to switching elements Q1 and Q2. Electronic components mounted on multilayer board B1A other than switching elements Q1 and Q2 may be disposed at the foregoing positions. This structure decreases unnecessary radiation to these electronic components.

Exemplary Embodiment 3

Figure 14:
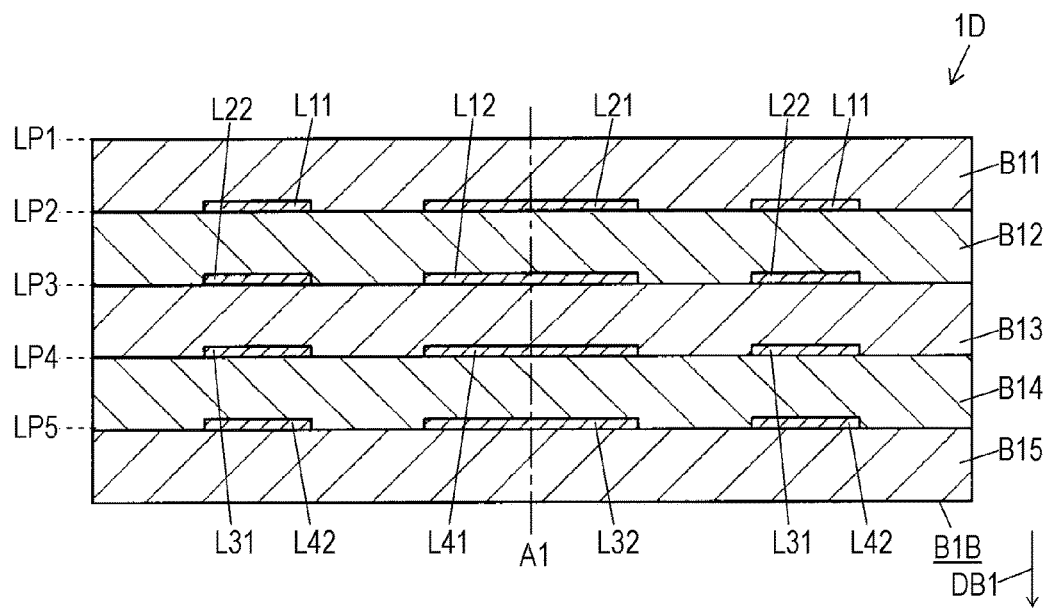
FIG. 14 is a schematic cross-sectional view of a transformer according to Exemplary Embodiment 3.
Figure 15A:
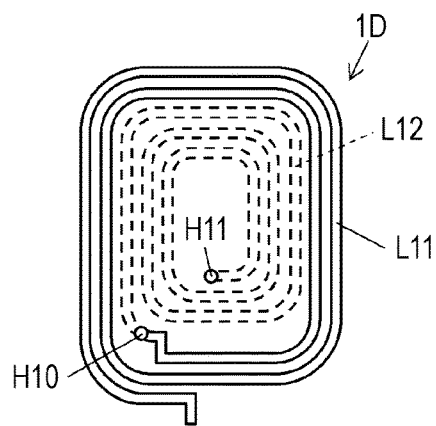
FIG. 15A is a schematic top view of the transformer according to Embodiment 3 for illustrating coils of the transformer.
Figure 15B:
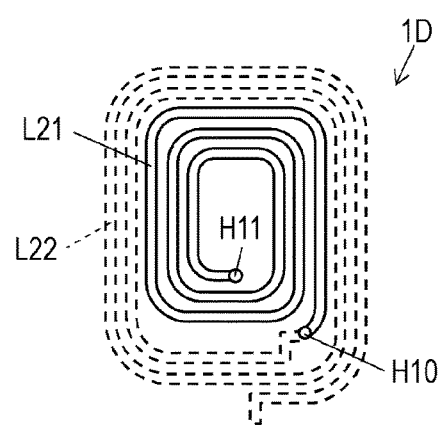
FIG. 15B is a schematic top view of the transformer according to Embodiment 3 for illustrating coils of the transformer.

FIG. 14 is a schematic cross-sectional view of transformer 1D according to Exemplary Embodiment 3. FIGS. 15A and 15B are schematic top views of transformer 1D according to Embodiment 3 for illustrates arrangements of sub coils. In FIGS. 14, 15A, and 15B, components identical to those of transformer 1 according to Embodiment 1 illustrated in FIGS. 1A to 4 are denoted by the same reference numerals.

Transformer 1D according to Embodiment 3 includes multilayer board B1B including insulation layers B11 to B15 stacked in thickness direction DB1, instead of multilayer board B1 of transformer 1 according to Embodiment 1 illustrated in FIG. 4. In transformer 1D in accordance with Embodiment 3, sub coils L11 and L12 are provided on layer planes LP2 and LP3 different from each other, respectively, as illustrated in FIG. 14. Sub coils L21 and L22 are provided on layer planes LP2 and LP3 different from each other, respectively, as illustrated in FIG. 14. Sub coils L31 and L32 are provided on layer planes LP4 and LP5 different from each other, respectively, as illustrated in FIG. 14. Sub coils L41 and L42 are provided on layer planes LP4 and LP5 different from each other, respectively, as illustrated in FIG. 14. FIGS. 15A and 15B do not show multilayer board B1B.

As illustrated in FIG. 14, centers of sub coils L11, L12, L21, and L22 are disposed on axis A1 extending in thickness direction DB1 (up-down direction) of multilayer board BIB. Sub coils out of sub coils L11, L12, L21, and L22 disposed on the same layer plane do not overlap each other within the layer plane.

Figure 16A:
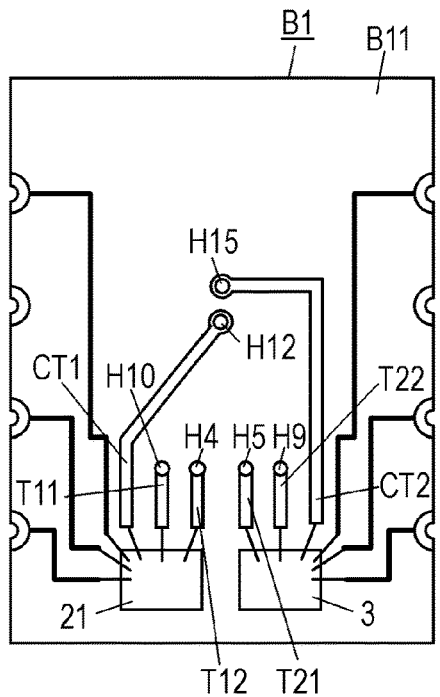
FIG. 16A is a schematic top view of an insulation layer having a primary coil of the transformer provided thereon according to Embodiment 3.
Figure 16B:
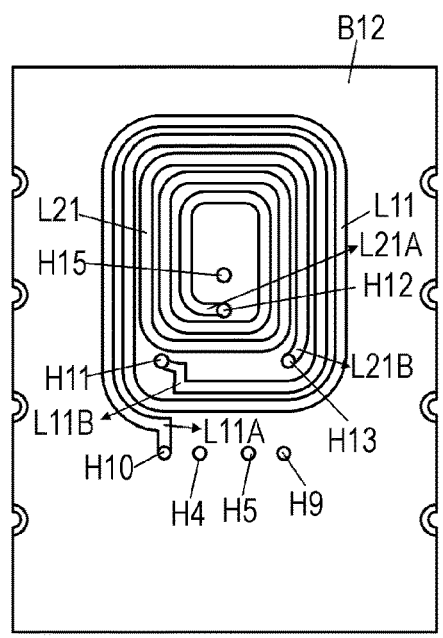
FIG. 16B is a schematic top view of an insulation layer having the primary coil of the transformer provided thereon according to Embodiment 3.
Figure 16C:
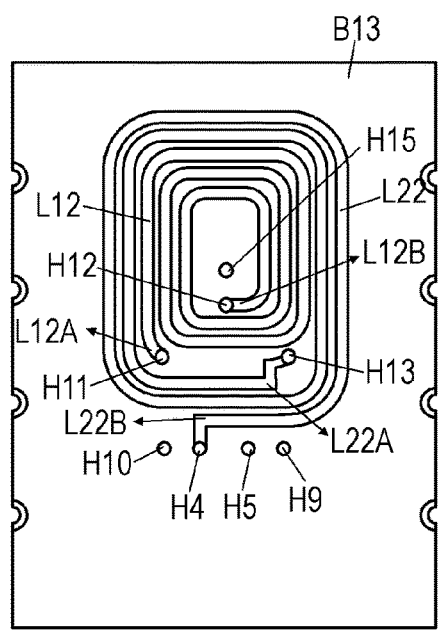
FIG. 16C is a schematic top view of an insulation layer having the primary coil of the transformer provided thereon according to Embodiment 3.
Figure 17A:
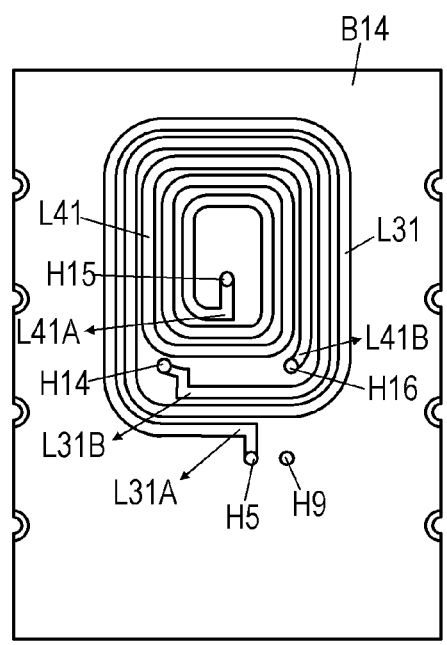
FIG. 17A is a schematic top view of an insulation layer having a secondary coil of the transformer provided thereon according to Embodiment 3.
Figure 17B:
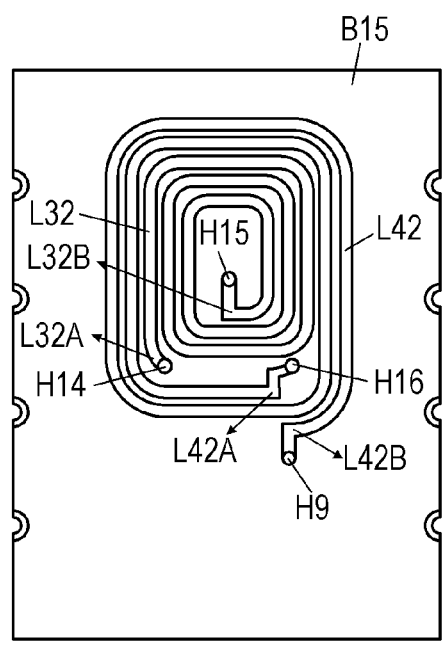
FIG. 17B is a schematic top view of an insulation layer having the secondary coil of the transformer provided thereon according to Embodiment 3.

FIGS. 16A to 16C are schematic top views of insulation layers B11, B12, and B13 on which primary coil P1 of transformer 1D is provided. FIGS. 17A and 17B are schematic top views of insulation layers B13 and B14 on which secondary coil S1 of transformer 1D is provided. In transformer 1D in accordance with Embodiment 3, no sub coil is provided on the upper surface of insulation layer B11 (layer plane LP1) as illustrated in FIGS. 14 and 16A. Sub coils L11 and L12 and sub coils L21 and L22 constituting primary coil P1 are provided on the upper surfaces of insulation layers B12 and B13, as illustrated in FIGS. 16B and 16C. On the other hand, sub coils L31 and L32 and sub coils L41 and L42 constituting secondary coil S1 are provided on the upper surfaces of insulation layers B14 and B15, as illustrated in FIGS. 17A and 17B.

More specifically, sub coil L11 is provided on the upper surface of insulation layer B12 (layer plane LP2), as illustrated in FIG. 16B. End L11A of sub coil L11 is electrically connected to input port T11 through via-conductor H10 while end L11B of sub coil L11 is electrically connected to end L12A of sub coil L12 through via-conductor H11. As illustrated in FIG. 16C, sub coil L12 is provided on the upper surface of insulation layer B13 (layer plane LP3). End L12B of sub coil L12 is electrically connected to intermediate tap CT1 through via-conductor H12.

As illustrated in FIG. 16B, sub coil L21 is provided inside sub coil L11 to be surrounded by sub coil L11 on the upper surface of insulation layer B12 (layer plane LP2). End L21A of sub coil L21 is electrically connected to intermediate tap CT1 through via-conductor H12 while end L21B of sub coil L21 is electrically connected to end L22A of sub coil L22 through via-conductor H13. As illustrated in FIG. 16C, sub coil L22 is provided outside sub coil L12 to surround sub coil L12 on the upper surface of insulation layer B13 (layer plane LP3). End L22B of sub coil L22 is electrically connected to input port T12 through via-conductor H4.

As illustrated in FIG. 17A, sub coil L31 is provided on the upper surface of insulation layer B14 (layer plane LP4). End L31A of sub coil L31 is electrically connected to output port T21 through via-conductor H5 while end L31B of sub coil L31 is electrically connected to end L32A of sub coil L32 through via-conductor H14. As illustrated in FIG. 17B, sub coil L32 is provided on the upper surface of insulation layer B15 (layer plane LP5). End L32B of sub coil L32 is electrically connected to intermediate tap CT2 through via-conductor H15.

As illustrated in FIG. 17A, sub coil L41 is provided inside sub coil L31 to be surrounded by sub coil L31 on the upper surface of insulation layer B14 (layer plane LP4). End L41A of sub coil L41 is electrically connected to intermediate tap CT2 through via-conductor H15 while end L41B of sub coil L41 is electrically connected to end L42A of sub coil L42 through via-conductor H16. As illustrated in FIG. 17B, sub coil L42 is provided outside sub coil L32 to surround sub coil L32 on the upper surface of insulation layer B15 (layer plane LP5). End L42B of sub coil L42 is electrically connected to output port T22 through via-conductor H9.

In multilayer board B1B thus constructed, sub coils L11 and L12 face sub coils L22 and L21, respectively, in thickness direction DB1 of multilayer board B1B (up-down direction), as illustrated in FIG. 14. Similarly, sub coils L31 and L32 face sub coils L42 and L41, respectively, in thickness direction DB1 as illustrated in FIG. 14.

In transformer 1D in accordance with Embodiment 3, the number of insulation layers on which primary coil P1 and secondary coil S1 are provided becomes smaller than that of transformer 1 according to Embodiment 1. More specifically, in transformer 1 in accordance with Embodiment 1, the number of insulation layers on which primary coil P1 and secondary coil S1 are provided is eight (see FIG. 4). However, the number of insulation layers of transformer 1D in accordance with Embodiment 3 decreases to four (see FIG. 14) while insulation layer B15 does not contribute to an electrostatic capacitance between coil conductors. Accordingly, a length of multilayer board B1 of transformer 1D in thickness direction DB1 according to Embodiment 3 becomes smaller than the length of transformer 1 according to Embodiment 1 in thickness direction DB1 of multilayer board B1B.

Moreover, in transformer 1D in accordance with Embodiment 3, centers of sub coils L11 and L12 and sub coils L21 and L22 are disposed on axis A1. Sub coils L11 and L12 and sub coils L21 and L22 disposed on identical layers do not overlap each other within the identical layers. This configuration decreases a mounting area of multilayer board B1B of transformer 1D in accordance with Embodiment 3.

In transformer 1D in accordance with Embodiment 3, densities of magnetic fluxes generated by sub coils L11 and L12 are preferably equal to each another. Similarly, densities of magnetic fluxes generated by sub coils L21 and L22 are preferably equal to each other. In order to obtain this structure, the number of windings of sub coil L11 having a larger diameter than a diameter of sub coil L12 is smaller than the number of windings of sub coil L12. Similarly, the number of windings of sub coil L22 having a larger diameter than a diameter of sub coil L21 is smaller than the number of windings of sub coil L21.

Exemplary Embodiment 4

Figure 18A:
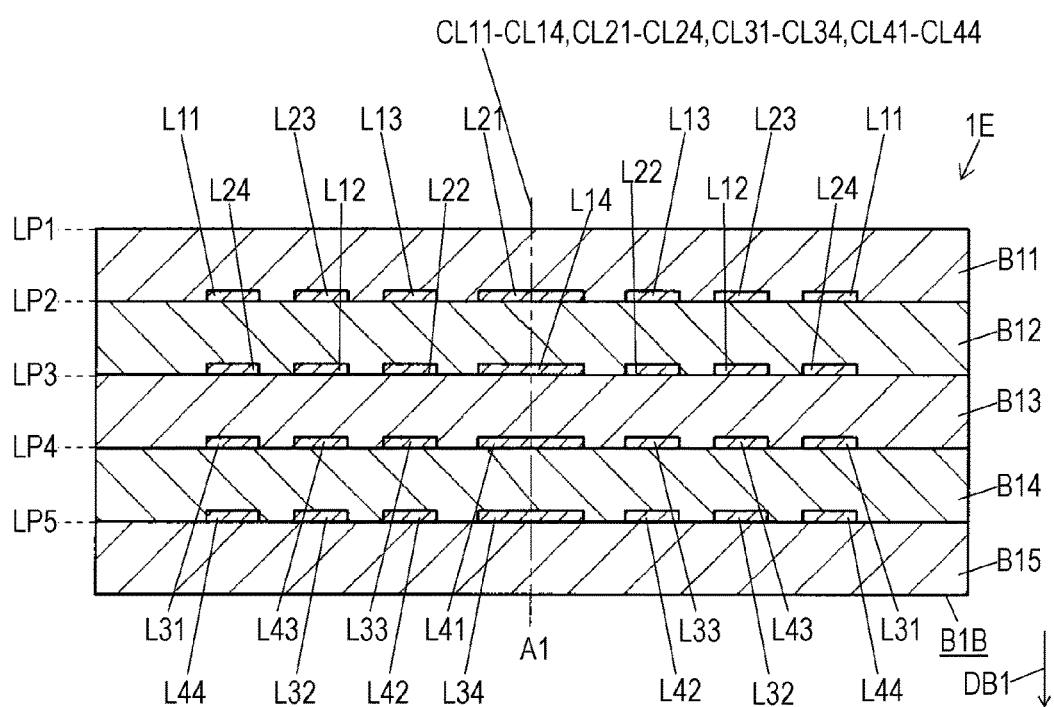
FIG. 18A is a schematic cross-sectional view of a transformer according to Exemplary Embodiment 4.

FIG. 18A is a schematic cross-sectional view of transformer 1E according to Exemplary Embodiment 4. FIG. 18B is a schematic circuit diagram of transformer 1E. FIGS. 19A and 19B are schematic top views of transformer 1E for illustrating sub coils. In FIGS. 18A, 18B, 19A, and 19B, components identical to those of transformer 1 according to Embodiment 1 illustrated in FIGS. 1A to 4 are denoted by the same reference numerals.

In transformer 1E in accordance with Embodiment 4, coil L1 includes plural (four in this example) sub coils L11 to L14 electrically connected in series to each other. Coil L2 includes plural (four in this example) sub coils L21 to L24 electrically connected in series to each other. Coil L3 includes plural (four in this example) sub coils L31 to L34 electrically connected in series to each other. Coil L4 includes plural (four in this example) sub coils L41 to L44 electrically connected in series to each other.

Transformer 1E according to Embodiment 4 includes multilayer board B1B including insulation layers B11 to B15 stacked on one another in thickness direction DB1, instead of multilayer board B1 of transformer 1 according to Embodiment 1 illustrated in FIG. 4. In transformer 1E in according to Embodiment 4, sub coils L11 to L14 are alternately provided on two different layer planes LP2 and LP3, as illustrated in FIG. 19A. Sub coils L21 to L24 are alternately provided on two different layer planes LP2 and LP3, as illustrated in FIG. 19B. Similarly, sub coils L31 to L34 are alternately provided on two different layer planes LP4 and LP5. Sub coils L41 to L44 are alternately provided on two different layer planes LP4 and LP5. FIGS. 19A and 19B do not show multilayer board B1B.

Sub coils L11 to L14 and L21 to L24 are disposed such that coil axes CL11 to CL14 and CL21 to CL24 of sub coils L11 to L14 and L21 to L24 are disposed on single axis A1 (see FIG. 18A) extending in thickness direction DB1 of multilayer board B1 (up-down direction). In addition, sub coils out of sub coils L11 to L14 and sub coils L21 to L24 disposed on a layer plane out of layer planes LP1 to LP5 do not overlap each other.

An arrangement of sub coils L11 to L14 and sub coils L21 to L24 will be described below with reference to FIGS. 18A, 19A, and 19B. Sub coil L11 is provided on the upper surface of insulation layer B12 (layer plane LP2). End L11A of sub coil L11 is electrically connected to input port T11 while end L11B of sub coil L11 is electrically connected to end L12A of sub coil L12 through via-conductor H17. End L11A of sub coil L11 constitutes end L1A of coil L1. Sub coil L12 is provided on the upper surface of insulation layer B13 (layer plane LP3). End L12B of sub coil L12 is electrically connected to end L13A of sub coil L13 through via-conductor H18.

Sub coil L13 is provided inside sub coil L11 to be surrounded by sub coil L11 on the upper surface of insulation layer B12 (layer plane LP2). End L13B of sub coil L13 is electrically connected to end L14A of sub coil L14 through via-conductor H19. Sub coil L14 is provided inside sub coil L12 to be surrounded by sub coil L12 on the upper surface of insulation layer B13 (layer plane LP3). End L14B of sub coil L14 is electrically connected to intermediate tap CT1 through via-conductor H20. End L14B of sub coil L14 constitutes end L1B of coil L1.

Sub coil L21 is provided on the upper surface of insulation layer B12 (layer plane LP2). End L21A of sub coil L21 is electrically connected to intermediate tap CT1 through via-conductor H20 while end L21B of sub coil L21 is electrically connected to end L22A of sub coil L22 through via-conductor H21. End L21A of sub coil L21 constitutes end L2A of coil L2. Sub coil L22 is provided on the upper surface of insulation layer B13 (layer plane LP3). End L22B of sub coil L22 is electrically connected to end L23A of sub coil L23 through via-conductor H22.

Sub coil L23 is provided outside sub coil L21 to surround sub coil L21 on the upper surface of insulation layer B12 (layer plane LP2). End L23B of sub coil L23 is electrically connected to end L24A of sub coil L24 through via-conductor H23. Sub coil L24 is provided outside sub coil L22 to surround sub coil L22 on the upper surface of insulation layer B13 (layer plane LP3). End L24B of sub coil L24 is electrically connected to input port T12 through via-conductor H4. End L24B of sub coil L24 constitutes end L2B of coil L2.

In multilayer board B1B thus constructed, sub coils L11 and L12 face sub coils L24 and L23, respectively, in thickness direction DB1 of multilayer board B1B (up-down direction), as illustrated in FIG. 18A. Similarly, sub coils L13 and L14 face sub coils L22 and L21, respectively, in thickness direction DB1.

Sub coils L31 to L34 and sub coils L41 to L44 are disposed on insulation layers B14 and B15 in an arrangement similar to the above arrangement illustrated in FIG. 18A. Sub coil L31 is provided on the upper surface of insulation layer B14 (layer plane LP4). End L31A of sub coil L31 is electrically connected to output port T21 while end L31B of sub coil L31 is electrically connected to end L32A of sub coil L32 through via-conductor passing from the upper surface to the lower surface of insulation layer B14. End L31A of sub coil L31 constitutes end L3A of coil L3. Sub coil L32 is provided on the upper surface of insulation layer B15 (layer plane LP5). End L32B of sub coil L32 is electrically connected to end L33A of sub coil L33 through the via-conductor.

Sub coil L33 is provided inside sub coil L31 to be surrounded by sub coil L31 on the upper surface of insulation layer B14 (layer plane LP4). End L33B of sub coil L33 is electrically connected to end L34A of sub coil L34 through the via-conductor passing from the upper surface to the lower surface of insulation layer B14. Sub coil L34 is provided inside sub coil L32 to be surrounded by sub coil L32 on the upper surface of insulation layer B15 (layer plane LP5). End L34B of sub coil L34 is electrically connected to intermediate tap CT2 through the above via-conductor. End L34B of sub coil L34 constitutes end L3B of coil L3.

Sub coil L41 is provided on the upper surface of insulation layer B14 (layer plane LP4). End L41A of sub coil L41 is electrically connected to intermediate tap CT2 through the via-conductor passing from the upper surface to the lower surface of insulation layer B14 while end L41B of sub coil L41 is electrically connected to end L42A of sub coil L42 through the via-conductor passing from the upper surface to the lower surface of insulation layer B14. End L41A of sub coil L41 constitutes end L4A of coil L4. Sub coil L42 is provided on the upper surface of insulation layer B15 (layer plane LP5). End L42B of sub coil L42 is electrically connected to end L43A of sub coil L43 through the above via-conductor.

Sub coil L43 is provided outside sub coil L41 to surround sub coil L41 on the upper surface of insulation layer B14 (layer plane LP4). End L43B of sub coil L43 is electrically connected to end L44A of sub coil L44 through the via-conductor passing from the upper surface to the lower surface of insulation layer B14. Sub coil L44 is provided outside sub coil L42 to surround sub coil L42 on the upper surface of insulation layer B15 (layer plane LP5). End L44B of sub coil L44 is electrically connected to output port T22 through the via-conductor passing from the upper surface to the lower surface of insulation layer B14. End L44B of sub coil L44 constitutes end L4B of coil L4.

In multilayer board B1B thus constructed, sub coils L31 and L32 face sub coils L44 and L43, respectively, in thickness direction DB1 of multilayer board B1B (up-down direction), as illustrated in FIG. 18A. Similarly, sub coils L33 and L34 face sub coils L42 and L41, respectively, in thickness direction DB1.

In transformer 1E in accordance with Embodiment 4, the number of insulation layers having primary coil P1 and secondary coil S1 provided thereon becomes smaller than that of transformer 1 according to Embodiment 1. More specifically, in transformer 1 in accordance with Embodiment 1, the number of insulation layers having primary coil P1 and secondary coil S1 provided thereon is eight (see FIG. 4). The number of insulation layers of transformer 1E in accordance with Embodiment 4 decreases to four (see FIG. 18A) while insulation layer B15 does not contribute to an electrostatic capacitance between coil conductors. Accordingly, a length of the multilayer board of transformer 1E in thickness direction DB1 according to Embodiment 4 becomes smaller than the length of transformer 1 according to Embodiment 1.

Moreover, in transformer 1E in accordance with Embodiment 4, coil axes CL11 to CL14 and CL21 to CL24 of sub coils L11 to L14 and sub coil L21 to L24 are located on single axis A1. Sub coils L11 to L14 and sub coils L21 to L24 disposed on identical layer planes do not overlap each other within the identical layer plane. Accordingly, a mounting area of multilayer board B1B of transformer 1E in accordance with Embodiment 4 also can be decreased.

Examples of transformers 1 and 1A to 1E, switching power supply 2 and 2A to 2C, and isolator 4 according to Embodiments 1 to 4 are described. However, configurations described herein are presented as just examples. The present invention is not limited to these specific exemplary embodiments, but may be modified in various ways in accordance with designs or the like without departing from technical spirits of the present invention. For example, coil L1 may be constituted by three or more sub coils. This applies to coil L2, coil L3, and coil L4.

In the above embodiments, terms, such as "upper surface", "lower surface", "up-down direction", indicating directions indicate relative directions determined only by relative positional relationships between components of the transformers, and do not indicate absolute directions, such as a vertical direction.

REFERENCE MARKS IN THE DRAWINGS 1, 1A to 1E transformer
2, 2A to 2C switching power supply
4 isolator
5 isolation circuit
6 signal processing circuit
B1 multilayer board
B11 to B18 insulation layer
CP1 to CP4 coil pair
L1 coil (first coil)
L11, L12 sub coil (first sub coil)
L2 coil (second coil)
L21, L22 sub coil (second sub coil)
L3 coil (third coil)
L31, L32 sub coil (third sub coil)
L4 coil (fourth coil)
L41, L42 sub coil (fourth sub coil)
LP1 to LP9 layer plane
P1 primary coil
PS1 external power supply
Q1 switching element (first switching element)
Q2 switching element (second switching element)
S1 secondary coil

The invention claimed is:

1. A transformer comprising:
a multilayer board including a plurality of insulation layers stacked on one another in a thickness direction;
a primary coil provided on at least one of the plurality of insulation layers; and
a secondary coil provided on at least one of the plurality of insulation layers, the secondary coil being magnetically coupled to the primary coil,
wherein the primary coil includes
a first coil includes a plurality of first sub coils electrically connected in series to each other, and
a second coil that includes a plurality of second sub coils electrically connected in series to each other,
wherein surfaces of the plurality of insulation layers constitute a plurality of layer planes of the multilayer board,
wherein at least two of the plurality of first sub coils are provided on respective layer planes out of the plurality of layer planes different from each other,
wherein at least two of the plurality of second sub coils are provided on respective layer planes out of the plurality of layer planes different from each other,
wherein an average of positions of the plurality of first sub coils in the thickness direction is aligned with an average of positions of the plurality of second sub coils in the thickness direction,
wherein the primary coil further includes a first intermediate tap electrically connected to the first coil and the second coil,
wherein the plurality of first sub coils extend from the first intermediate tap and are connected in series from the first intermediate tap,
wherein the plurality of second sub coils extend from the first intermediate tap and are connected in series from the first intermediate tap, and
wherein a first sub coil out of the plurality of first sub coils connected in series at an n-th order counted from the first intermediate tap faces, in the thickness direction, a second sub coil out of the plurality of second sub coils connected in series at an n-th order counted from the first intermediate tap in the thickness direction, where n is an arbitrary natural number.

2. The transformer according to claim 1,
wherein each of the plurality of first sub coils faces respective one of the plurality of second sub coils in the thickness direction as to constitute respective one of a plurality of coil pairs together with the respective one of the plurality of second sub coils, and
wherein the plurality of coil pairs are arranged in parallel with the plurality of layer planes.

3. The transformer according to claim 2,
wherein a plurality of sub coils out of the plurality of first sub coils and the plurality of second sub coils are disposed along one of the plurality of layer planes, and
wherein magnetic fluxes passing through respective centers of the plurality of sub coils have directions opposite to each other in the thickness direction.

4. The transformer according to claim 1, wherein respective centers of the plurality of first sub coils and respective centers of the plurality of second sub coils are arranged on an axis extending in the thickness direction.

5. The transformer according to claim 4,
wherein each of the plurality of first sub coils is disposed on respective one of the plurality of layer planes in the thickness direction, and
wherein each of the plurality of second sub coils is disposed on respective one of the plurality of layer planes in the thickness direction.

6. The transformer according to claim 4, wherein the secondary coil includes a third coil, a fourth coil, and a second intermediate tap electrically connected to the third coil and the fourth coil.

7. The transformer according to claim 6,
wherein the third coil includes a plurality of third sub coils electrically connected in series to each other,
wherein the fourth coil includes a plurality of fourth sub coils electrically connected in series to each other, and
wherein the third coil and the fourth coil are arranged symmetrically to the first coil and the second coil in the thickness direction.

8. The transformer according to claim 1, wherein the secondary coil includes a third coil, a fourth coil, and an intermediate tap electrically connected to the third coil and the fourth coil.

9. The transformer according to claim 8,
wherein the third coil includes a plurality of third sub coils electrically connected in series to each other,
wherein the fourth coil includes a plurality of fourth sub coils electrically connected in series to each other, and
wherein the third coil and the fourth coil are arranged symmetrically to the first coil and the second coil in the thickness direction.

10. A switching power supply comprising:
the transformer according to claim 1;
a first switching element configured to open and close a power supply path from an external power supply to the first coil;
a second switching element configured to open and close a power supply path from the external power supply to the second coil; and
a control circuit configured to control the first switching element and the second switching element to cause a current to flow alternately in the first coil and the second coil.

11. A switching power supply comprising:
the transformer according to claim 3;
a first switching element configured to open and close a power supply path from an external power supply to the first coil;
a second switching element configured to open and close a power supply path from the external power supply to the second coil; and
a control circuit configured to control the first switching element and the second switching element to cause a current to flow alternately in the first coil and the second coil,
wherein the first switching element and the second switching element are disposed between first sub coils out of the plurality of first sub coils disposed adjacent to each other in a direction parallel with the plurality of layer planes.

12. An isolator comprising:
the switching power supply according to claim 10;
an isolation circuit having a primary side and a secondary side for electrically isolating an input signal input to the primary side from an output signal output to the secondary side in accordance with the input signal; and
a signal processing circuit configured to process the input signal and the output signal,
wherein the isolation circuit and the signal processing circuit are disposed on the multilayer board.

13. The transformer according to claim 1, wherein the secondary coil includes a third coil, a fourth coil, and a second intermediate tap electrically connected to the third coil and the fourth coil.

14. The transformer according to claim 13,
wherein the third coil includes a plurality of third sub coils electrically connected in series to each other,
wherein the fourth coil includes a plurality of fourth sub coils electrically connected in series to each other, and
wherein the third coil and the fourth coil are arranged symmetrically to the first coil and the second coil in the thickness direction.

15. The transformer according to claim 2, wherein the secondary coil includes a third coil, a fourth coil, and a second intermediate tap electrically connected to the third coil and the fourth coil.

16. The transformer according to claim 15,
wherein the third coil includes a plurality of third sub coils electrically connected in series to each other,
wherein the fourth coil includes a plurality of fourth sub coils electrically connected in series to each other, and
wherein the third coil and the fourth coil are arranged symmetrically to the first coil and the second coil in the thickness direction.

17. An isolator comprising:
the switching power supply according to claim 11;
an isolation circuit having a primary side and a secondary side for electrically isolating an input signal input to the primary side from an output signal output to the secondary side in accordance with the input signal; and
a signal processing circuit configured to process the input signal and the output signal,
wherein the isolation circuit and the signal processing circuit are disposed on the multilayer board.

* * * * *